(12) United States Patent
Yilmaz

(10) Patent No.: US 10,777,661 B2
(45) Date of Patent: Sep. 15, 2020

(54) METHOD OF MANUFACTURING SHIELDED GATE TRENCH MOSFET DEVICES

(71) Applicant: IPOWER SEMICONDUCTOR, Gilroy, CA (US)

(72) Inventor: Hamza Yilmaz, Gilroy, CA (US)

(73) Assignee: IPOWER SEMICONDUCTOR, Gilroy, CA (US)

(*) Notice: Subject to any disclaimer, the term of this patent is extended or adjusted under 35 U.S.C. 154(b) by 0 days.

(21) Appl. No.: 16/414,769

(22) Filed: May 16, 2019

(65) Prior Publication Data
US 2019/0273152 A1 Sep. 5, 2019

Related U.S. Application Data

(63) Continuation-in-part of application No. 16/290,834, filed on Mar. 1, 2019.
(Continued)

(51) Int. Cl.
| | |
|---|---|
| H01L 21/336 | (2006.01) |
| H01L 29/66 | (2006.01) |
| H01L 29/40 | (2006.01) |
| H01L 29/423 | (2006.01) |
| H01L 21/308 | (2006.01) |
| H01L 29/49 | (2006.01) |

(Continued)

(52) U.S. Cl.
CPC ...... *H01L 29/66734* (2013.01); *H01L 21/266* (2013.01); *H01L 21/28088* (2013.01); *H01L 21/3086* (2013.01); *H01L 29/407* (2013.01); *H01L 29/4236* (2013.01); *H01L 29/4966* (2013.01); *H01L 29/7813* (2013.01)

(58) Field of Classification Search
CPC ............. H01L 21/266; H01L 21/28088; H01L 21/3086
See application file for complete search history.

(56) References Cited

U.S. PATENT DOCUMENTS

| 5,219,777 A | 6/1993 | Kang |
| 8,816,431 B2 | 8/2014 | Bowers |

(Continued)

FOREIGN PATENT DOCUMENTS

WO 2019169361 A1 9/2019

OTHER PUBLICATIONS

PCT, International Search Report and Written Opinion of the International Searching Authority for International Application No. PCT/US2019/020441, dated May 23 2019, 8 pages.
(Continued)

*Primary Examiner* — Samuel A Gebremariam
(74) *Attorney, Agent, or Firm* — Halit N. Yakupoglu

(57) ABSTRACT

A shielded gate trench MOSFET device structure is provided. The device structure includes MOS gate trenches and p body contact trenches formed in an n type epitaxial silicon layer overlying an n+ silicon substrate. Each MOS gate trench includes a gate trench stack having a lower n+ shield poly silicon layer separated from an upper n+ gate poly silicon layer by an inter poly silicon oxide (IPO) layer. The IPO layer can be formed by either depositing a silicon oxide layer or thermally growing a poly silicon oxide layer with minimal thickness variation. The method is used to form both MOS gate trenches and p body contact trenches in self-aligned or non self-aligned shielded gate trench MOSFET device manufacturing.

27 Claims, 12 Drawing Sheets

Related U.S. Application Data

(60) Provisional application No. 62/637,274, filed on Mar. 1, 2018.

(51) Int. Cl.
  *H01L 21/28* (2006.01)
  *H01L 21/266* (2006.01)
  *H01L 29/78* (2006.01)

(56) References Cited

U.S. PATENT DOCUMENTS

| | | |
|---|---|---|
| 8,847,310 B1 | 9/2014 | Korec |
| 9,224,853 B2 | 12/2015 | Pan |
| 10,056,461 B2 | 8/2018 | Lui et al. |
| 2002/0036319 A1 | 3/2002 | Baliga |
| 2009/0096018 A1 | 4/2009 | Izumi |
| 2010/0190307 A1 | 7/2010 | Lee et al. |
| 2012/0248530 A1 | 10/2012 | Lui et al. |
| 2016/0172482 A1 | 6/2016 | Bobde et al. |
| 2017/0330964 A1* | 11/2017 | Siemieniec ........... H01L 23/482 |
| 2019/0273157 A1 | 9/2019 | Yilmaz |
| 2020/0044078 A1* | 2/2020 | Yilmaz ............... H01L 29/7813 |

OTHER PUBLICATIONS

PCT, International Search Report and Written Opinion of the International Searching Authority for International Application No. PCT/US2019/032757, dated Aug. 16 2019, 9 pages.

* cited by examiner

METHOD OF MANUFACTURING SHIELDED GATE TRENCH MOSFET DEVICES

CROSS REFERENCE TO RELATED APPLICATIONS

This application is a continuation in part of U.S. patent application with Ser. No. 16/290,834 filed on Mar. 1, 2019 which relates to and claims priority from U.S. provisional patent application Ser. No. 62/637,274 filed on Mar. 1, 2018, which are expressly incorporated by reference herein in their entirety.

BACKGROUND

Field of the Invention

The present invention relates to semiconductor devices, more particularly, to device structures and methods of forming trench metal oxide semiconductor field effect transistor (MOSFET) devices.

Description of the Related Art

In power metal oxide semiconductor field effect transistor (MOSFET) devices, as the resistance per square area is kept decreasing due to the availability of new structures, advanced process techniques and tools, die sizes for MOSFET products are also getting smaller and smaller. There are several challenges to be addressed in advanced trench MOSFET products with smaller die sizes, for example: (1) increasing thermal resistance of the smaller die and, (2) increasing robustness of the MOSFETs to handle much higher current density under unclamped inductive, high dv/dt and diode recovery mode of operations compared to low performing larger die area type power MOSFETs.

Manufacturing thinner dies and improved power device packaging can address the thermal resistance related issues in power MOSFET devices. Improving the robustness of power MOSFET devices in smaller dies includes, for example, (1) providing structures and processes to localize breakdown in the middle of the MOSFET body, (2) ensuring device avalanche breakdown to occur in the active device cells (MOSFETs) rather than the termination areas, (3) keeping extremely low p body to source shorting resistance to prevent turn on of parasitic NPN bipolar transistor of the MOSFET. Mask misalignment of a non-self-aligned p body contact to trench causes an increased shorting resistance between the p body and the n+ source of the MOSFET.

SUMMARY

An aspect of the present invention includes a method for forming shielded gate trench MOSFET devices, the method including: providing a silicon layer having a first type conductivity overlying a semiconductor substrate; forming, on a front surface of the silicon layer, an array of a plurality of gate trenches and contact trenches disposed in an alternating fashion in an active region of the front surface, the array of the gate trenches and the contact trenches extending orthogonally from the front surface toward the semiconductor substrate, wherein each gate trench defining a first depth and a first width and each contact trench defining a second depth and a second width, and wherein the first depth and the first width are greater than the second depth and the second width, respectively; forming in each gate trench a gate trench stack including: growing a shield oxide layer including silicon oxide on side walls and a bottom wall of each gate trench; forming a first doped poly silicon layer on the shield oxide layer within the gate trench; forming a silicon oxide layer on the first doped poly silicon layer; forming an undoped poly silicon layer on the silicon oxide layer; reducing the thickness of exposed portions of the shield oxide layer on the side walls to a predetermined thickness; removing the undoped poly silicon layer to expose the silicon oxide layer underneath; etching the shield oxide layer having the predetermined thickness from the side walls of the gate trench, which results in exposing surface of the trench side walls above the silicon oxide layer, wherein etching the shield oxide layer having the predetermined thickness also reduces the thickness of the silicon oxide layer by the same predetermined thickness; growing a gate oxide layer on the trench side walls and exposed silicon surfaces; and forming a second doped poly silicon layer on the gate oxide layer and the silicon oxide layer and planarizing it.

Another aspect of the present invention includes a method for forming shielded gate trench MOSFET devices, the method including: providing a silicon layer having a first type conductivity overlying a semiconductor substrate; forming, on a front surface of the silicon layer, an array of a plurality of gate trenches and contact trenches disposed in an alternating fashion in an active region of the front surface, the array of the gate trenches and the contact trenches extending orthogonally from the front surface toward the semiconductor substrate, wherein each gate trench defining a first depth and a first width and each contact trench defining a second depth and a second width, and wherein the first depth and the first width are greater than the second depth and the second width, respectively; forming in each gate trench a gate trench stack including: growing a shield oxide layer including silicon oxide on side walls and a bottom wall of each gate trench; forming a first doped poly silicon layer on the shield oxide layer within the gate trench; forming a silicon oxide layer on the first doped poly silicon layer; forming an undoped poly silicon layer on the silicon oxide layer; removing exposed portions of the shield oxide layer from the side walls of the gate trench, which results in exposing surface of the trench side walls above the silicon oxide layer; etching the undoped poly silicon layer to expose the silicon oxide layer underneath, wherein etching the undoped poly silicon layer also etches the surface of the side walls, which are exposed, resulting in increasing the width of the gate trench to a third width above the silicon oxide layer with respect to the first width of the gate trench below the silicon oxide layer; growing a gate oxide layer on the surface of the trench side walls and all the exposed silicon surfaces; and forming a second doped poly silicon layer on gate oxide layer and the silicon oxide layer and planarizing it.

Another aspect of the present invention provides a method for forming shielded gate trench MOSFET devices, the method including: providing a silicon layer having a first type conductivity overlying a semiconductor substrate; forming, on a front surface of the silicon layer, an array of a plurality of gate trenches disposed in an active region of the front surface, the array of the gate trenches extending orthogonally from the front surface toward the semiconductor substrate, forming in each gate trench a gate trench stack including: growing a shield oxide layer including silicon oxide on side walls and a bottom wall of each gate trench; forming a first doped poly silicon layer on the shield oxide layer within the gate trench; forming a silicon oxide layer on the first doped poly silicon layer; forming an undoped poly silicon layer on the silicon oxide layer; reducing the thickness of exposed portions of the shield oxide layer on the side walls to a predetermined thickness; removing the undoped poly silicon layer to expose the silicon oxide layer underneath; etching the shield oxide layer having the predetermined thickness from the side walls of the gate trench, which results in exposing surface of the trench side walls above the silicon oxide layer, wherein etching the shield oxide layer having the predetermined thickness also reduces the thickness of the silicon oxide layer by the same predetermined thickness; growing a gate oxide layer on the side walls of the trenches and the all exposed silicon surfaces; forming a second doped poly silicon layer on the gate oxide layer and the silicon oxide layer and planarizing it; forming body regions and source regions extending between the gate trenches; forming a dielectric layer on the front surface; forming body contact trenches by etching through the dielectric layer and etching through the source regions between the trench gates; and forming a top metal layer for source electrodes and gate electrodes.

DETAILED DESCRIPTION

Figure 1:
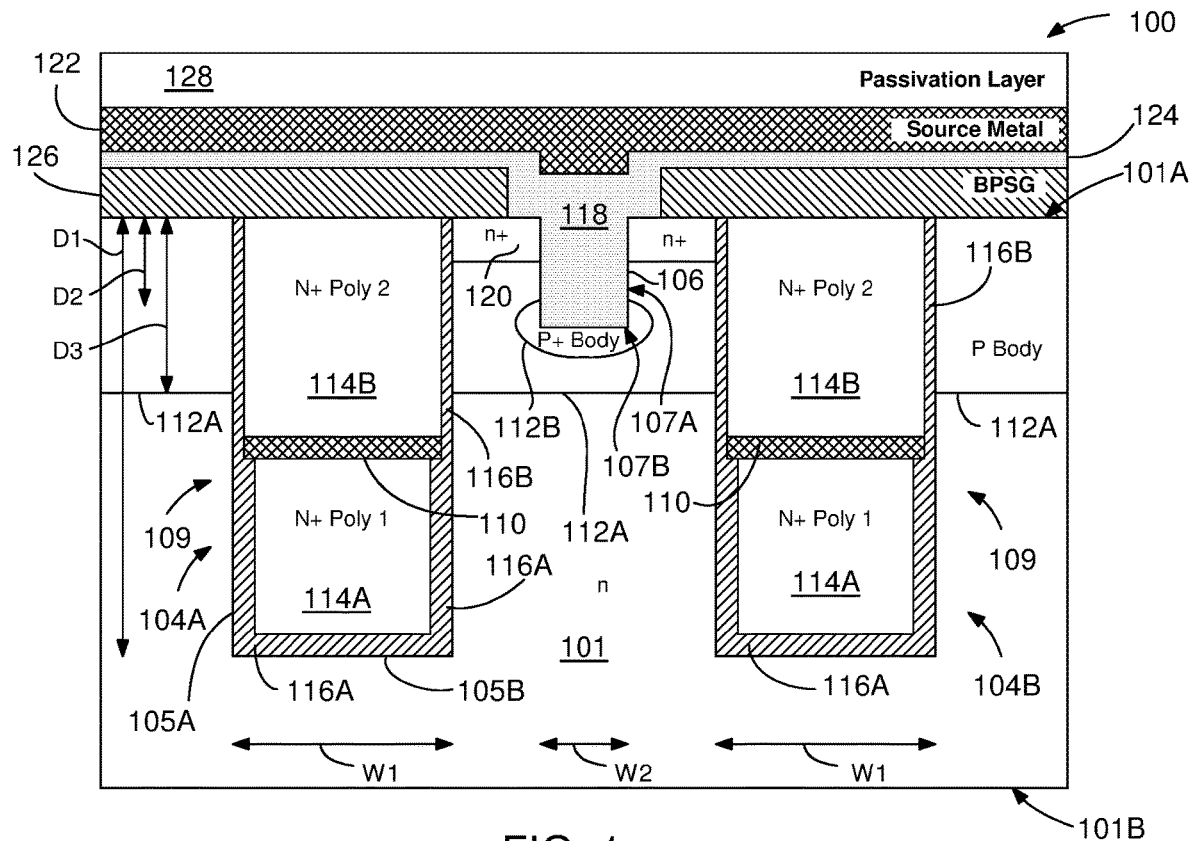
FIG. 1 is a schematic illustration of an embodiment of the present invention including a shielded gate trench MOSFET device structure.

In addition to robustness improvements of the power MOSFET devices, embodiments of the present invention concern with methods of forming electrically insulating inter poly dielectric layers such as inter poly silicon dielectric (IPD) layers or the inter poly silicon oxide (IPO) layers for semiconductor devices such as shielded gate trench (SGT) MOSFET devices and other semiconductor devices. IPD and IPO terms may be used interchangeably throughout this application to refer to inter poly silicon dielectrics.

In MOS gate trenches of the SGT MOSFET device structures, thickness variations in the IPO layer between the shield poly silicon (poly 1) at the bottom half of the trench and the gate poly silicon (poly 2) at the upper half of the trench may cause unwanted variations in the drain to source resistance (Rds) and the gate to drain capacitance (Cgd). Embodiments of the present invention includes methods for minimizing thickness variations in the IPO layers in addition to having self-aligned source and p body contact with respect to gate trench to achieve minimized performance variations in SGT trench MOSFET and prevent failures during high temperature gate bias reliability (HTGB) test.

Conventionally, after the shield poly silicon deposition, the silicon oxide layer on the side walls of the MOS gate trench above the shield poly silicon layer may be removed and an IPO layer may be formed on the shield poly silicon layer by partially oxidizing it during the gate oxide layer forming step, which also forms a gate oxide layer on the exposed portions of the trench side walls. Although oxide may grow relatively thicker on the poly silicon than the single crystal silicon side walls, IPO grown over the shield poly silicon during the gate oxide forming stage may not be thick enough to meet Vgs-max rating reliably. That is why in such conventional techniques, for example for manufacturing split gate or shielded gate type MOSFET structures, after the shield poly silicon deposition step and the following etch down process step, additional silicon oxide may be deposited to fill the gate trench. This additional silicon oxide filling the gate trench is then planarized and etched down to form an IPO layer that is about 1.5 to 5 times thicker than the gate oxide. In this conventional process, thickness variations in the IPO may be very large, because the final IPO thickness may vary due to depth variations of MOS gate trenches and etch back variations of the shield poly silicon as well as etch back variations of the deposited silicon oxide.

As opposed to the conventional techniques, embodiments of the present invention may provide a thicker IPO formation method on top of the shield poly silicon layer with minimal IPO thickness variation. Since the IPO growth or deposition starts at the surface of the shield poly silicon layer in the MOS gate trench, the process may be more repeatable with less than about 5% variation and without being impacted from the trench depth and shield poly silicon etch variations.

Accordingly, in one embodiment, the present invention provides a trench MOSFET device including an array of a plurality of metal-oxide semiconductor (MOS) gate trenches, or gate trenches, and p body contact trenches, or contact trenches, formed on a semiconductor wafer. The semiconductor wafer may be a silicon wafer comprising an epitaxial silicon top layer formed on a silicon substrate. The gate trenches and contact trenches may be disposed in an alternating fashion in an active region on a top surface of the wafer and extending orthogonally into the wafer. The depth and the width of the contact trenches may be smaller than the depth and the width of the gate trenches. The contact trenches are disposed inside a p body region adjacent the gate trenches. A heavily doped p+ body region located at the bottom of the contact trenches may be in electrical contact with a source electrode of the MOSFET device via a portion of a contact material, or contact electrode, e.g., a metal filling, of the contact trench.

In one embodiment, each gate trench may include a gate trench stack formed by a process of the present invention. The gate trench stack of the present invention may include a first doped poly silicon layer separated from a second doped poly silicon layer by an electrically insulating poly silicon oxide layer. In one embodiment, the first and second doped poly silicon layers may be n+ doped poly silicon. The process of forming the gate trench stack may begin with lining the gate trench floor and side walls with a trench oxide layer conformally and continuously coating the trench sidewalls and trench floor. In the following step, a first doped poly silicon layer may be deposited into the gate trench, which is coated with the trench oxide layer, to preferably partially fill the gate trench.

A top portion of the first doped poly silicon layer (shield poly Si) may be converted to a poly silicon oxide layer having a predetermined thickness by oxidizing the first doped poly silicon layer in the gate trench, which may be followed by depositing a sacrificial material on top of the poly silicon oxide layer. The sacrificial material may be an undoped polysilicon which may fully fill the gate trench. The undoped poly silicon filling the gate trench may be etched back to reduce its thickness so as to form a sacrificial cap layer on the poly silicon oxide layer. In the following step, exposed portions of the trench oxide layer on the side walls of the gate trench may be thinned down to reduce its thickness to a predetermined thickness, which may be followed by removal of the sacrificial cap layer from the surface of the poly silicon oxide layer. Once the surface of the silicon oxide layer is exposed, the remainder of the trench oxide layer having the predetermined thickness on the trench side walls and above the poly silicon oxide layer may be fully etched and removed to clean and expose silicon surface of the gate trench walls. This etching process may also reduce the thickness of the poly silicon oxide layer by the same predetermined thickness.

Following the cleaning of the remainder of the trench oxide from the upper portion of the gate trench walls, i.e., the portion of the trench oxide above the insulating poly silicon oxide layer, a gate oxide may be formed by oxidizing the cleaned silicon surfaces of the side walls of the gate trenches. A second doped poly silicon layer (gate poly Si) may be deposited to fill the upper portion of the gate trench. The second doped poly silicon layer may be in contact with the gate oxide layers on the trench side walls and the poly silicon oxide layer separating it from the first doped poly silicon layer. The IPO may be formed by two methods, by growing poly silicon oxide over first poly silicon layer by thermal oxidation of the first poly silicon or by simply depositing an oxide layer having a required thickness without changing the following process flow.

FIG. 1 illustrates, in schematic cross-sectional view, an embodiment of an active cell structure in a shielded gate trench MOSFET device structure 100 including a semiconductor layer 101 having a front surface 101A or a top surface 101A and a back surface 101B which may overlie a semiconductor substrate (not shown). The semiconductor layer 101 and the semiconductor substrate may be just a small exemplary portion of a larger die (not shown) or wafer that may include the exemplary active cell structure shown in FIG. 1. As will be shown below many semiconductor structures and active cell regions described in this disclosure may be formed on the same die using various processes using the same or different masking steps.

In one embodiment, the semiconductor layer 101 may be an epitaxial (epi) single crystal silicon layer grown over the semiconductor substrate. The semiconductor layer 101 may have a first type of conductivity, or n type of conductivity, i.e., doped with n type of dopants, such as arsenic (As) ions or phosphor (P) ions. The semiconductor substrate may also have n type of conductivity; however, it is doped with an n type of dopant concentration higher than the n dopant concentration of the semiconductor layer 101, which is denoted with n+ to indicate its high n dopant concentration.

The semiconductor layer 101 may include an array of a plurality of MOS gate trenches 104 and p body contact trenches 106 formed in an alternating fashion in an active area 108 of the MOSFET device 100, and extending orthogonally toward the back surface 101B from the front surface 101A. For clarity figures in this disclosure generally show only two MOS gate trenches 104, first MOS gate trench 104A and a second MOS gate trench 104B, located at both sides of the p body contact trench 106. An SGT MOSFET device may include a plurality of gate trenches and contact trenches disposed in an alternating fashion, i.e. an order of "gate trench/contact trench/gate trench/contact trench/ . . . ", in an active area of the device. In the following disclosure, MOS gate trenches will be referred to as gate trenches 104 and the p body contact trenches will be referred to as contact trenches 106.

Referring to FIG. 1, the gate trenches 104 and the contact trench 106 are rectangular in cross-section formed in the semiconductor layer 101 by patterning and etching the front surface 101A, and they extend parallel to one another along the front surface 101A of the semiconductor layer 101. During the process of forming them, the gate trenches 104 and the contact trenches 106 may or may not be self-aligned in the semiconductor layer 101, i.e., the measured distance separating each gate and contact trench in the array may be the same or different.

The gate trenches 104 are defined by side walls 105A and a bottom wall 105B, and the contact trenches 106 are defined by side walls 107A and a bottom wall 107B. The contact trench 106 may be symmetrically positioned between the gate trenches 104, i.e., self aligned manner. The gate trenches 104 may have a first depth denoted with D1 and a first width denoted with W1. The contact trenches 106 may have a second depth denoted with D2 and a second width denoted with W2. In one embodiment, D1 may be greater than D2, and W1 may be greater than W2. In another embodiment, D1/2 may be greater than D2, and W1/2 may be greater than W2. The first depth D1 may be in the range of about 1-10 microns and the second depth D2 may be in the range of about 0.3-1 micron. The first width W1 may be in the range of about 0.4-2 microns and the second width W2 may be in the range of about 0.15-0.3 microns.

A first contact region 112A or, a first p body contact region (p body), having a second type conductivity, or p type conductivity, may be formed by implanting p type dopants, such as boron (B) ions, to the semiconductor layer 101 through the front surface 101A. The first contact region 112A may have a rectangular cross section and formed in a portion of the semiconductor layer 101 between the gate trenches 104. The first contact region 112A may have a depth D3 measured from the front surface 101A. The depth D3 of the first contact region 112A may be less than the first depth D1 of the gate trench 104 and greater than the second depth D2 of the contact trench 106. An exemplary depth D3 for the first contact region may be in the range of about 0.3-1.0 micron.

The gate trenches 104 may include a gate trench stack 109 filling the trench cavity. The gate trench stack 109 may include a first poly silicon layer 114A, or a shield poly silicon, separated from a second poly silicon layer 114B, or a gate poly silicon, by an inter poly dielectric layer 110. The first poly silicon layer 114A may fill a bottom half of the gate trench 104 and the second poly silicon layer 114B may fill the upper half of the gate trench 104. In this embodiment, the inter poly dielectric layer 110 may be an inter poly silicon oxide layer 110, which will be referred to as IPO layer 110, hereinafter. A shield oxide layer 116A may be formed by the oxidation of the side walls 105A and the bottom wall 105B of the gate trench 104, thereby conformally coating the trench cavity. The shield oxide layer 116A and the IPO layer 110 may electrically insulate the first poly silicon layer 114A. As will be described more fully below, a gate oxide 116B, formed according to the present invention, and the IPO layer 110 may electrically insulate the second poly silicon layer 114B.

In one embodiment, both the first poly silicon layer 114A and the second poly silicon layer 114B may be doped with n type dopants, thus including n+ poly silicon material (n+ poly). This arrangement of poly silicon layers in the insulated gate trenches may be called double poly or shielded gate trench structures including n+ poly 1 (first n+ poly silicon layer) and n+ poly 2 (second n+ poly silicon layer). Shielded gate trench structures may yield low drain to gate capacitance for faster switching of the MOSFET device.

A second contact region 112B, or the second p body contact region (p+ body), may be formed under the contact trench 106 by implanting dopants of the second type of conductivity through the bottom wall 107B of the contact trench 106. The second contact region 112B may be doped with a p type dopant ion concentration higher than the p type dopant ion concentration of the first contact region 112A, which is denoted with p+. The second contact region 112B may be in contact with a contact conductor 118 filling the contact trench 106 and may include an elliptically curved border expanding from the bottom wall 107B and extending symmetrically in the direction of the gate trenches and the back surface 101B from the bottom wall. The second contact region 112B may be disposed about a symmetry center between two neighboring gate trenches 104A and 104B.

Referring to FIG. 1, source contact regions 120 adjacent the front surface 101A may extend between the contact conductor 118 and the gate trenches 104 at both sides of the contact trench 106. The source contact regions 120 may be doped with high doses of n type of dopant ions, and thus they will be referred to as n+ source contact regions or n+ source regions. The contact conductor 118 is a part of a buffer layer 124 or buffer metal 124. A source electrode 122, or source metal 122, may be in contact with the n+ source contact regions 120, the first contact region 112A and the second contact region 112B by the buffer layer 124 extending through a dielectric layer 126 and into the contact trenches 106. The dielectric layer 126 may be a borophosphosilicate glass (BPSG) layer. A passivation layer 128 may coat the source electrode 122, the source metal 122. The buffer layer 124 may be a layer of Ti/TiN/W which prevents aluminum spike into silicon and damaging shallow p body to drain junction. The source 122 electrode may be one of a layer of Al:Cu:Si, a layer of Al:Si or a layer of Al:Cu.

A process embodiment of forming the SGT MOSFET device structure 100 shown in FIG. 1 is shown and described with respect to FIGS. 2A-2M.

Figure 2A:
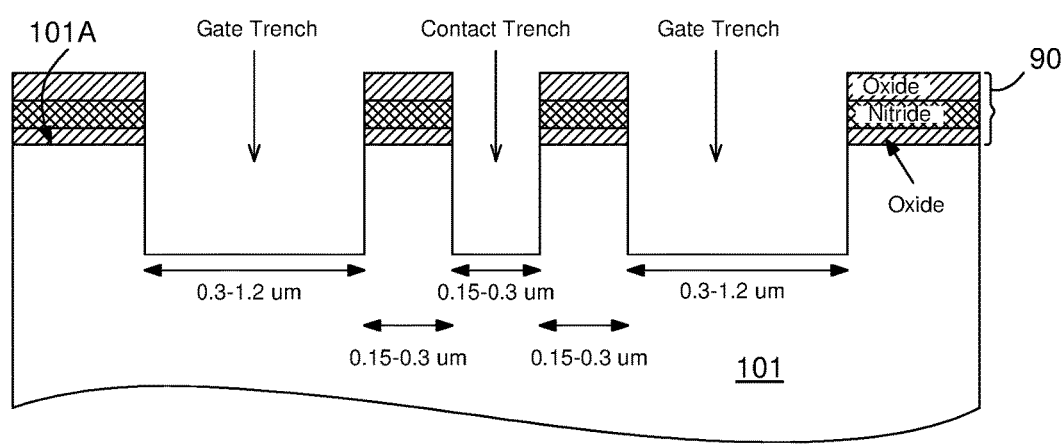
FIGS. 2A-2M are schematic illustrations of exemplary steps of a method embodiment for forming a shielded gate trench MOSFET device structure.

FIGS. 2A-2D show processing with a first mask (M1 mask) to form the gate trenches 104 and contact trenches 106 prior to forming of the gate trench stack 109 (FIG. 1) in the gate trenches. FIG. 2A shows only the semiconductor layer 101 which may be an n epitaxial layer (epitaxial silicon layer) of a wafer or die. Following figures are not to scale and may only show the n epitaxial layer portion of the wafer for clarity purposes. The n epitaxial layer 101 may be on an n+ substrate (not shown) which may have a thickness of greater than 500 μm. In one embodiment, the thickness of the n epitaxial layer 101, for 20-400V MOSFET devices, may be in the range of 2 to 40 μm. Before the etching process, a hard mask stack 90 including oxide layer (SiO$_2$), nitride layer (Si$_3$N$_4$), and oxide (SiO$_2$) layer, which is known as ONO, may be formed on the front surface 101A of the semiconductor layer 101. The oxide layers may have about 0.3-1 μm thickness and the nitride layer may have about 0.05-0.1 μm thickness.

FIG. 2A also shows processing for forming the gate trenches 104 and the contact trench 106 using a first mask (M1 mask) which is the gate trench and contact trench mask. M1 mask, may be used to define gate and contact trench regions and the silicon layer 101 may be etched down to form the gate and contact trenches. After the trench etching, gate trenches may have a depth of about 0.3-0.7 μm and width of about 0.3-1.2 μm; and contact trenches may have a depth of about 0.3-0.7 μm and width of about 0.15-0.3 μm. The distance between the gate trenches 104 and the contact trenches 106 may be in the range of about 0.15-0.3 μm.

Figure 2B:
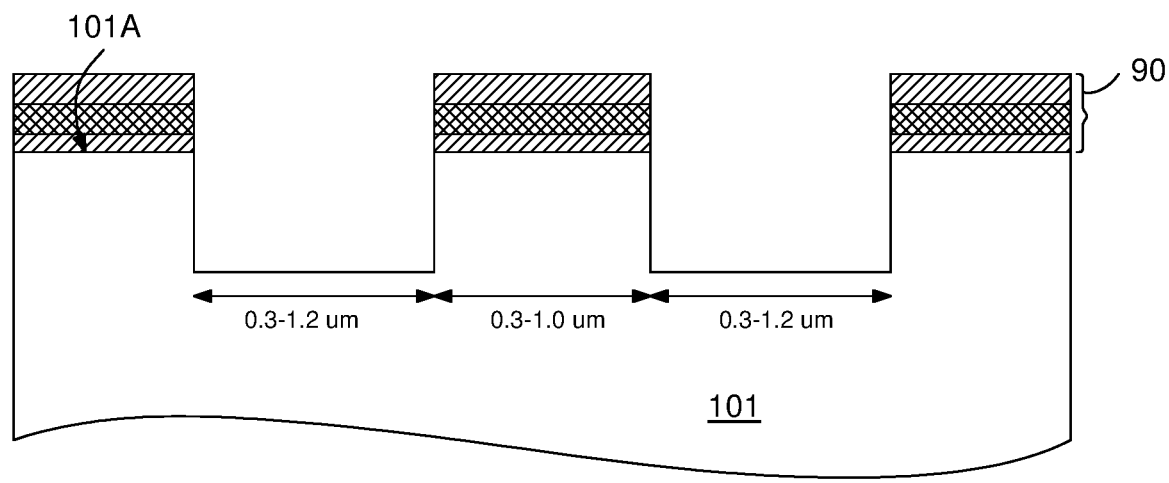

FIG. 2B shows an alternative process step with the same mask to form the gate trenches 104 after forming the hard mask stack 90 on the semiconductor layer 101. M1 mask may be used to define gate trench regions and the semiconductor layer 101 may be etched down to form the gate trenches 104. After the trench etching, gate trenches may have a depth of about 1-10 μm and width of 0.3-1.2 μm. The distance between the gate trenches 104 may be in the range of about 0.3-1 μm.

Figure 2C:
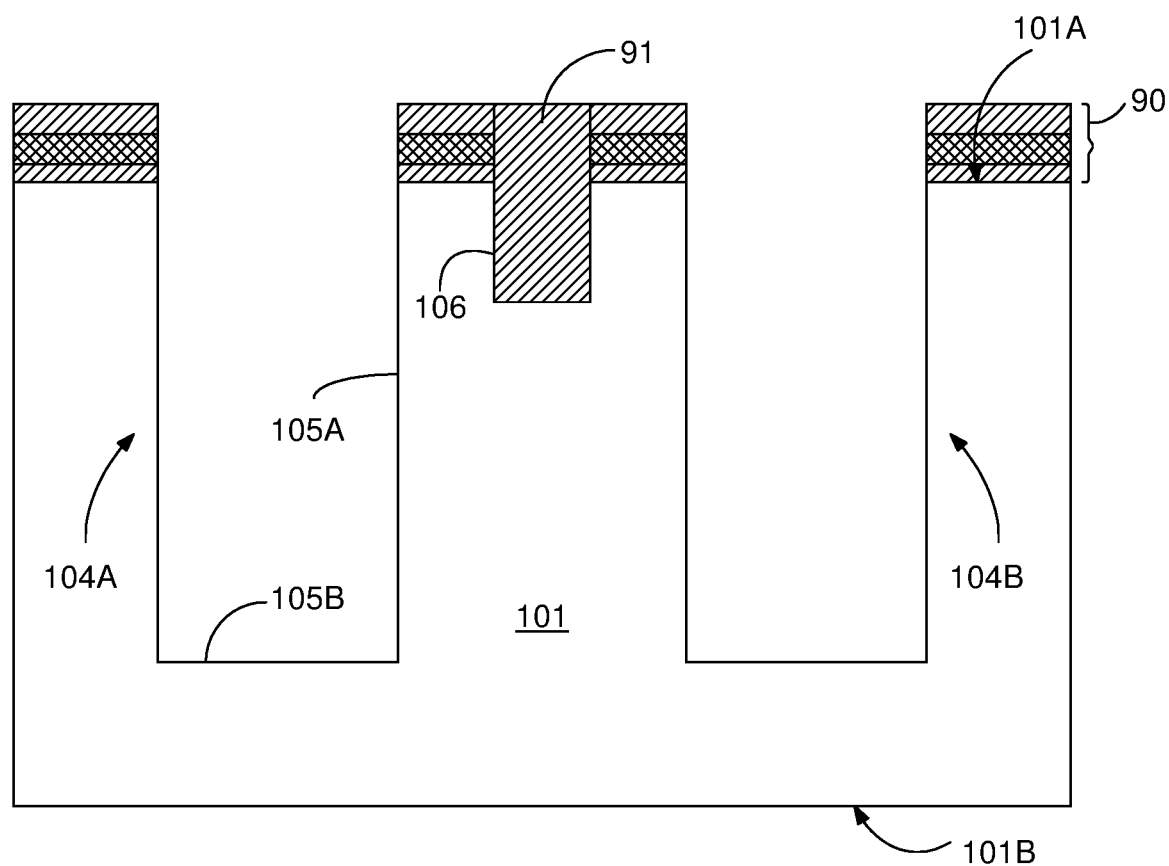

FIG. 2C shows further processing with M1 mask to further deepen the gate trenches 104, after the step shown in FIG. 2A. In this process step, after forming the gate trenches 104 and the contact trenches 106, an oxide layer 91 (SiO$_2$) with a thickness range of about 0.1-0.2 μm may be deposited over the front surface 101A. The oxide layer 91 may fully fill the contact trenches 106, which are narrower, while partially filling the gate trenches 104, which are wider. Next, an oxide etch step may be applied to isotopically remove the oxide from the gate trenches 104 while keeping a portion of the oxide layer 91 plugging the contact trenches 106. The process may continue with further etching of the gate trenches 104 in the silicon layer 101 and deepening them to a depth range of about 1-10 μm to form side walls 105A and the bottom wall 105B, as shown in FIG. 2C.

Figure 2D:
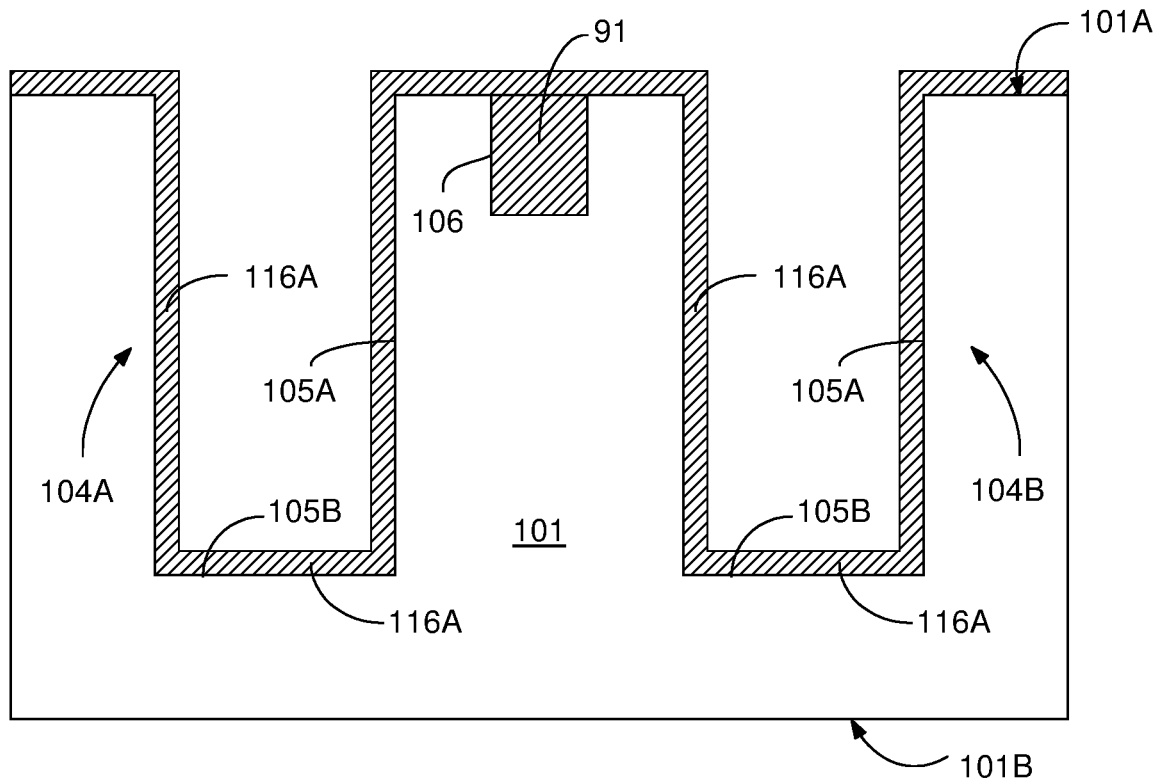

As shown in FIG. 2D, after removing the hard mask stack 90 including the SiO$_2$/Si$_3$N$_4$/SiO$_2$ layers, a gate trench oxide layer 116A, or a trench oxide layer 116A, for example SiO$_2$ layer in a thickness range of 50-500 nanometers (nm) may be thermally grown on the side walls 105A and the bottom wall 105B of the gate trenches 104. The trench oxide layer 116A may conformally coat the side walls 105A and the bottom wall 105B of the gate trenches 104.

FIGS. 2E-2K show processing with a second mask (M2 mask) to form the gate trench stack 109 including the first poly silicon layer 114A, the inter poly silicon dielectric 110 (IPO layer), and the second poly silicon layer 114B, as shown in FIG. 1.

Figure 2E:
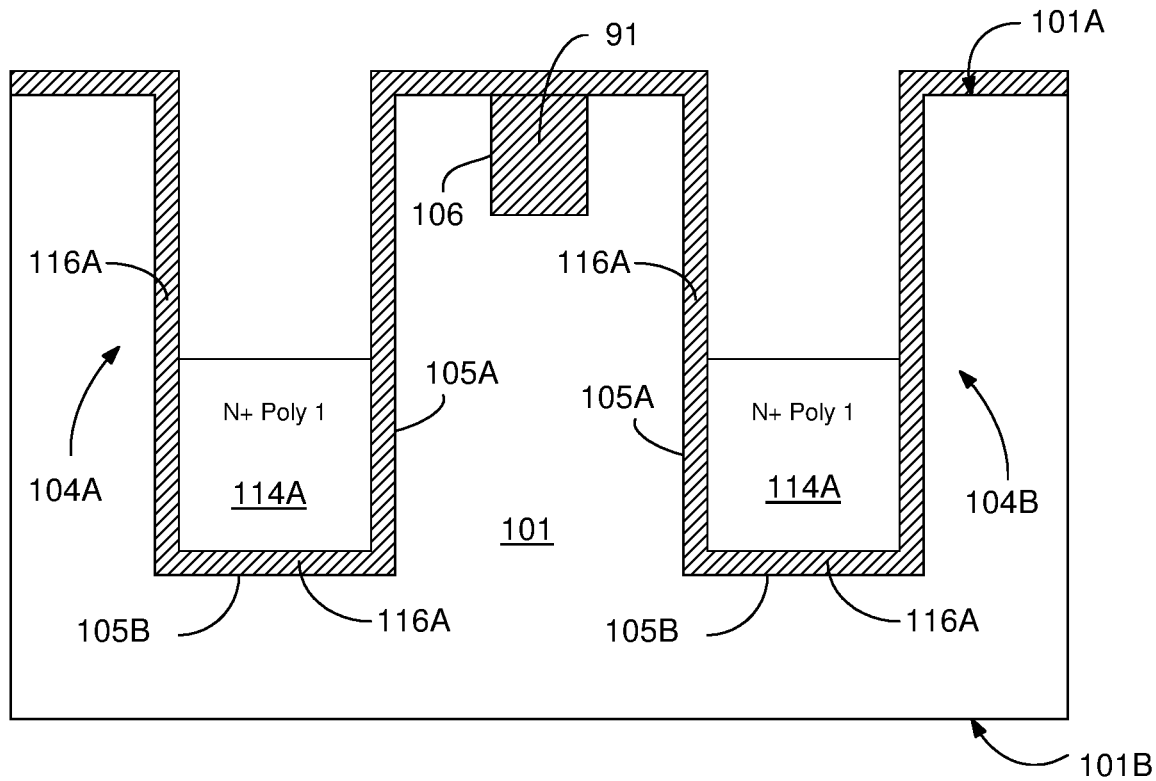

As shown in FIG. 2E, poly silicon material (n+ doped poly silicon) for the first poly silicon layer 114A may be deposited over the front surface 101A of the semiconductor layer 101 including the gate trenches 104 lined with the trench oxide layer 116A. The poly silicon material may fill the gate trenches 104, which are lined with the trench oxide 116A.

In the following step, the poly silicon material may be planarized using CMP (chemical mechanical polishing) and etched back to form the first poly silicon layer 114A to a targeted thickness within the gate trenches. An exemplary thickness for the first poly silicon layer 114A may be in the range of about 0.3-1 μm. The first poly silicon later 114A may be etched back to the target thickness using Mask 2. In one embodiment, the targeted thickness of the first poly silicon layer 114A may preferably be within the bottom half of the gate trenches 104. However, in other embodiments, the targeted thickness may be within the upper half of the gate trenches.

Figure 2F:
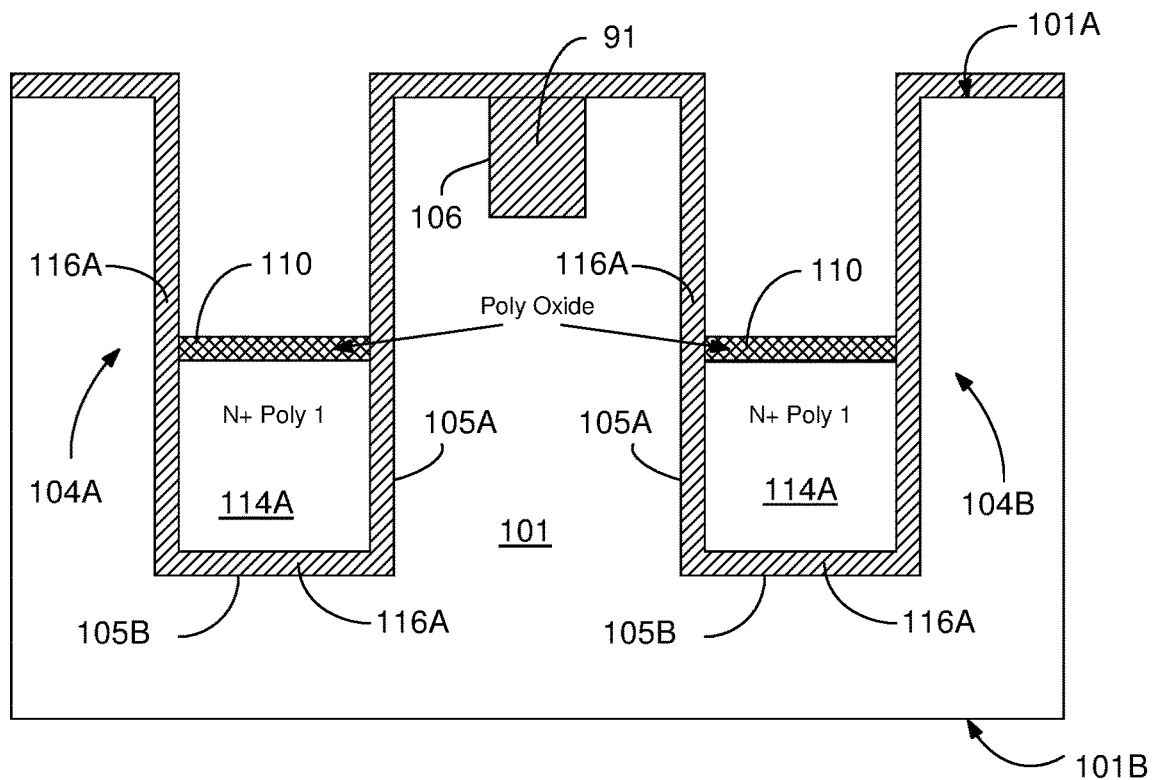

As shown in FIG. 2F, after the first poly silicon layer 114A deposition and etch back steps, the inter poly silicon oxide dielectric layer 110 may be formed on the first poly silicon layer. The inter poly silicon oxide dielectric layer 110 may be a poly silicon oxide layer and may be formed by oxidizing a top portion of the first poly silicon layer 114A. The inter poly silicon oxide dielectric layer 110 will be called the IPO layer 110 hereinafter. In one embodiment, a thickness range of the IPO layer 110 may be equal to about twice the thickness of the gate oxide layer, which will be formed later in the process, as shown in FIG. 2J. An exemplary thickness of the gate oxide may be in the range of 10-100 nm.

Figure 2G:
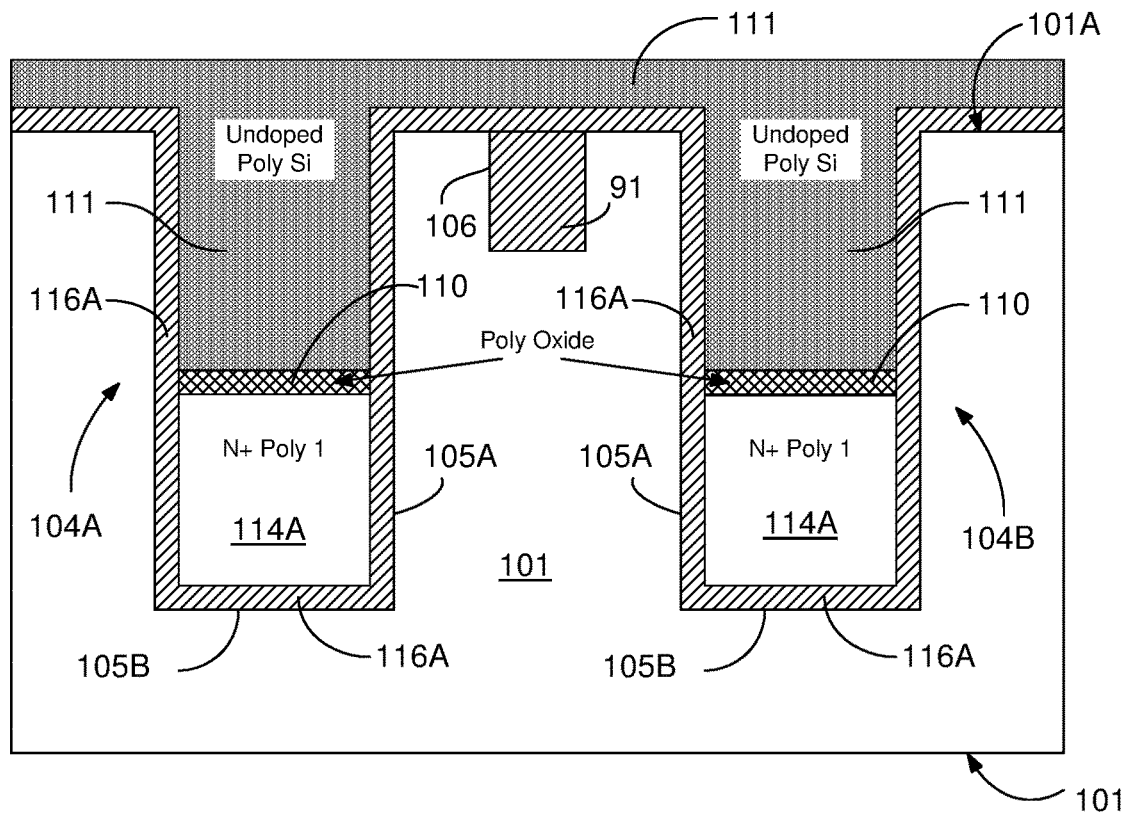

As shown in FIG. 2G, after forming the IPO layer 110, an undoped poly silicon, material or a UPS, may be deposited on the semiconductor layer 101 to form the UPS layer 111. The UPS material may coat the front surface 101A and fills the trench cavity over the IPO layer 110. The UPS material may have a smaller grain size than the doped poly silicon. Small grain size may provide a smooth and flat surface finish for the UPS layer 111.

Figure 2H:
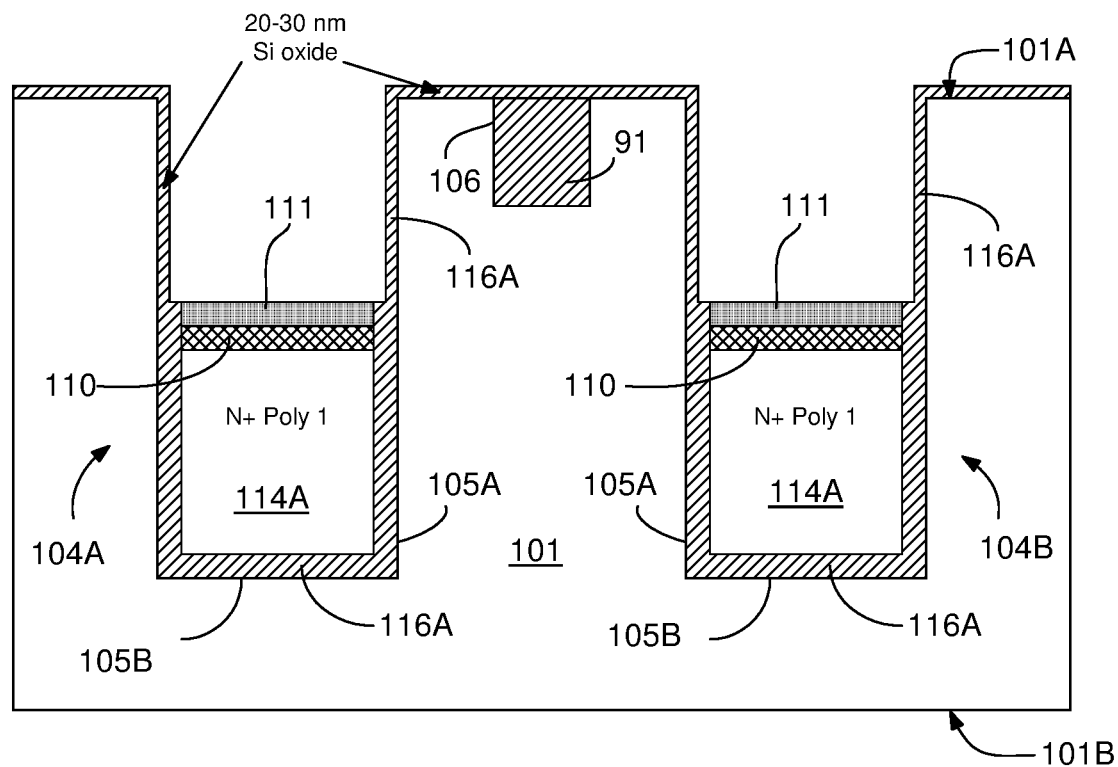

As shown in FIG. 2H, in the following process step, the UPS material may be planarized and a portion of it filling the trench cavity over the IPO layer 110 may be reduced to a thickness range of about 0.1 μm to form the UPS layer 111. The UPS layer 111 is a sacrificial layer to protect the IPO layer 110 from the etchants used to etch $SiO_2$ during the following process steps. After isotopically etching back the undoped poly silicon at a poly silicon etching process step, an oxide etching process may be conducted to reduce the thickness of the trench oxide layer 116A on the side walls 105A. In this process step, the portions of the trench oxide layer 116A on the trench side walls 105A, which are extending between the UPS layer 111 and the front surface 101A, may be etched back to a predetermined thickness range. In one example, the predetermined thickness of the trench oxide layer, after the applied etch back process, may be about 10-20 nm. During this $SiO_2$ etching step, the UPS layer 111 protects the IPO layer 110 underneath. The predetermined thickness may be selected to prevent the trench side walls from etching during the removal of UPS layer 111.

Figure 2I:
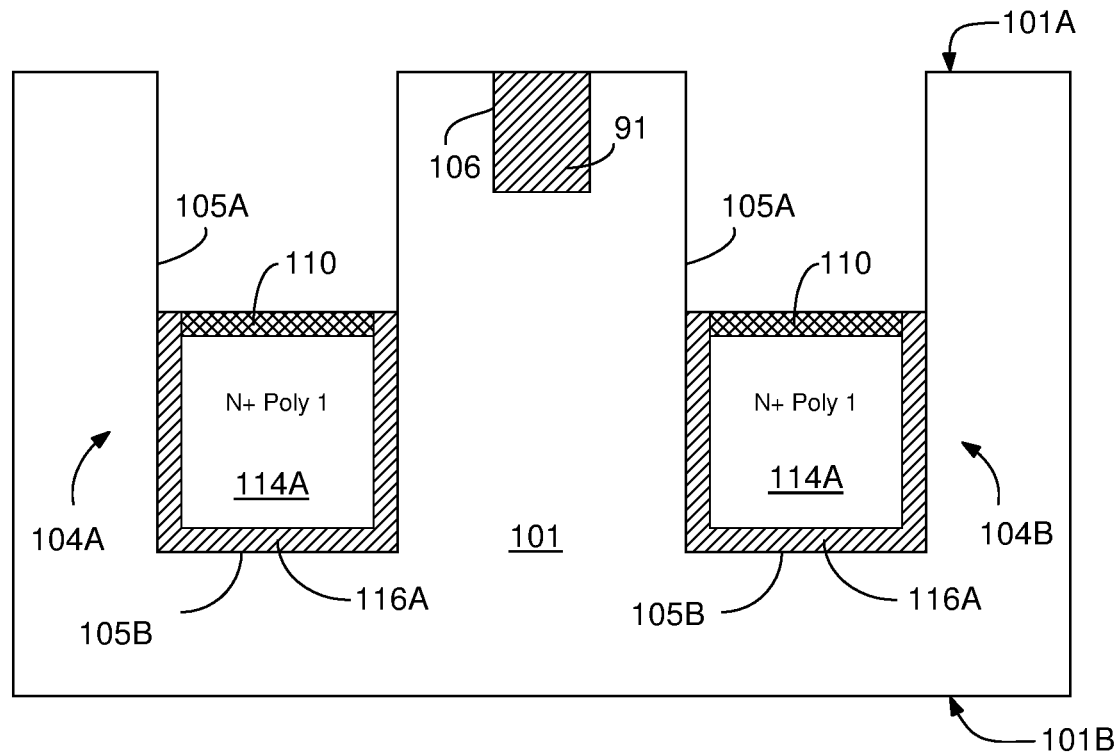
Figure 2J:
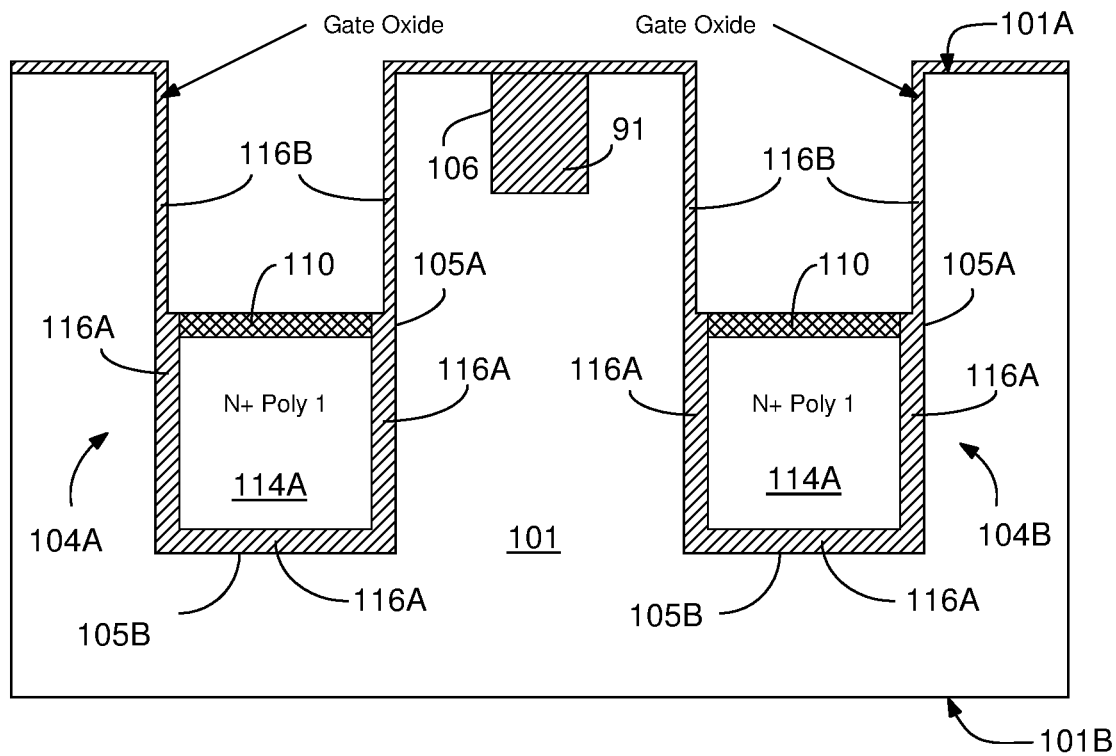

As shown in FIG. 2I, after reducing the thickness of the trench oxide layer 116A on the side walls to the desired thickness range, the UPS layer 111 may be removed using a poly silicon etching step, which exposes the surface of the IPO layer 110. Once the surface of the IPO layer 110 is exposed, another $SiO_2$ etch process is conducted to remove the trench oxide layer 116A, having the predetermined thickness, which is left on the portion of the side walls 105A that extend between the UPS layer 111 and the front surface 101A. This etching process step may also reduce the thickness of the IPO layer 110 by the same predetermined thickness which is about 20-30 nm in this example. Following the cleaning of the remainder of the trench oxide layer 116A from the upper portion of the gate trench side walls 105A, i.e., the portion of the trench oxide layer 116A above the IPO layer 110, a gate oxide layer 116B may be formed.

As shown in FIG. 2J, following the cleaning of the remainder of the trench oxide layer 116A from the upper portion of the gate trench walls, as described above, the gate oxide layer 116B may be formed by oxidizing the cleaned silicon surfaces of the side walls 105A of the gate trenches 104. The gate oxide layer 116B may have a thickness in the range of 10-150 nm and smoothly continues, without any gaps, from the trench oxide layer 116A surrounding the first poly silicon layer 114A together with the IPO layer 110. This remainder of the trench oxide layer 116A will be referred to as the shield oxide layer 116A hereinafter. The gate oxide layer 116B may be grown thermally and include a few percent chlorine to prevent drifting of the threshold voltage in the MOSFET device.

Figure 2K:
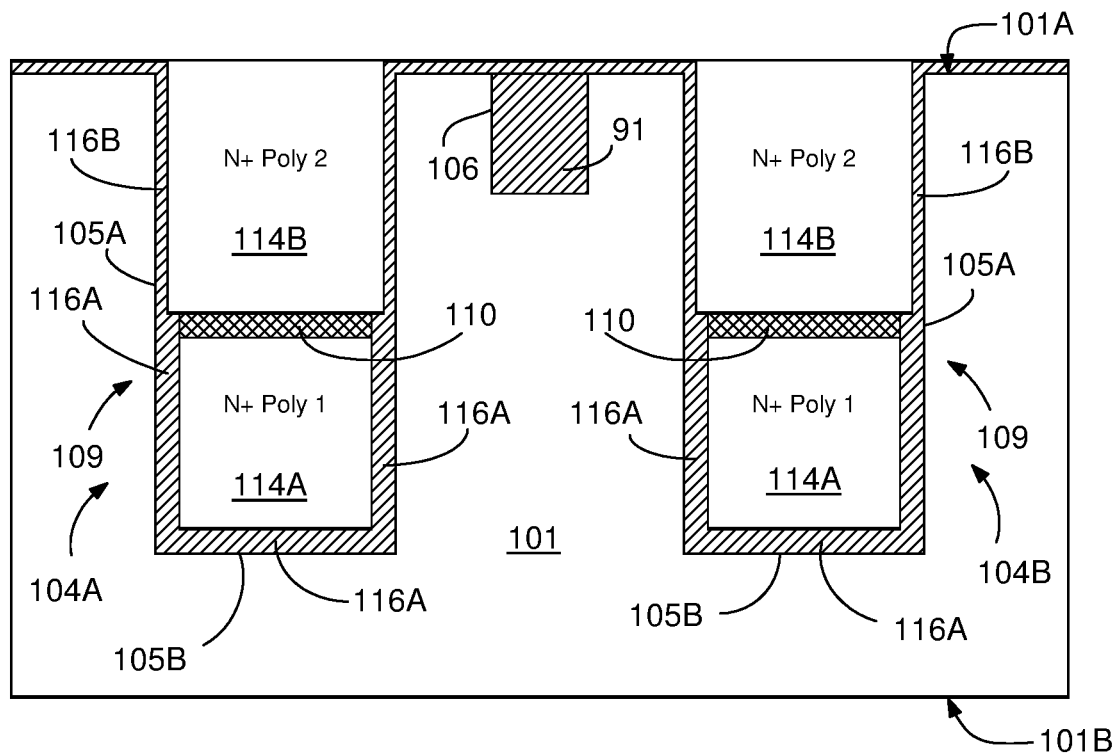

As shown in FIG. 2K, once the gate oxide layer 116B is grown on upper portion of the side walls 105A, the second poly silicon layer 114B may be formed in the cavity of the gate trench 104 defined by the IPO layer 110 on the first poly silicon layer 114A and the gate oxide layers 116B on the side walls 105A. The poly silicon material for the second poly silicon layer 114B may be deposited on the front surface 101A to fill the gate trenches 104 and cover the front surface 101A of the semiconductor layer 101. In the next step, the poly silicon material may be either planarized using a CMP process or etched back to form the second poly silicon layer 114B in the gate trenches 104. The etch back of the poly silicon may be performed using a third mask (mask 3). Formation of the second poly silicon layer 114B also completes the structure of the gate trench stack 109.

In the following process steps, using appropriate process masks the first contact region 112A (p body contact region), the source regions 120 (n+ source contact regions), BPSG layer 126, the second contact region 112B (p+ body contact region), the buffer layer 124, the source metal 122 (source electrode) and the passivation layer 128 may be formed, all of which are shown in FIG. 1.

Figure 2L:
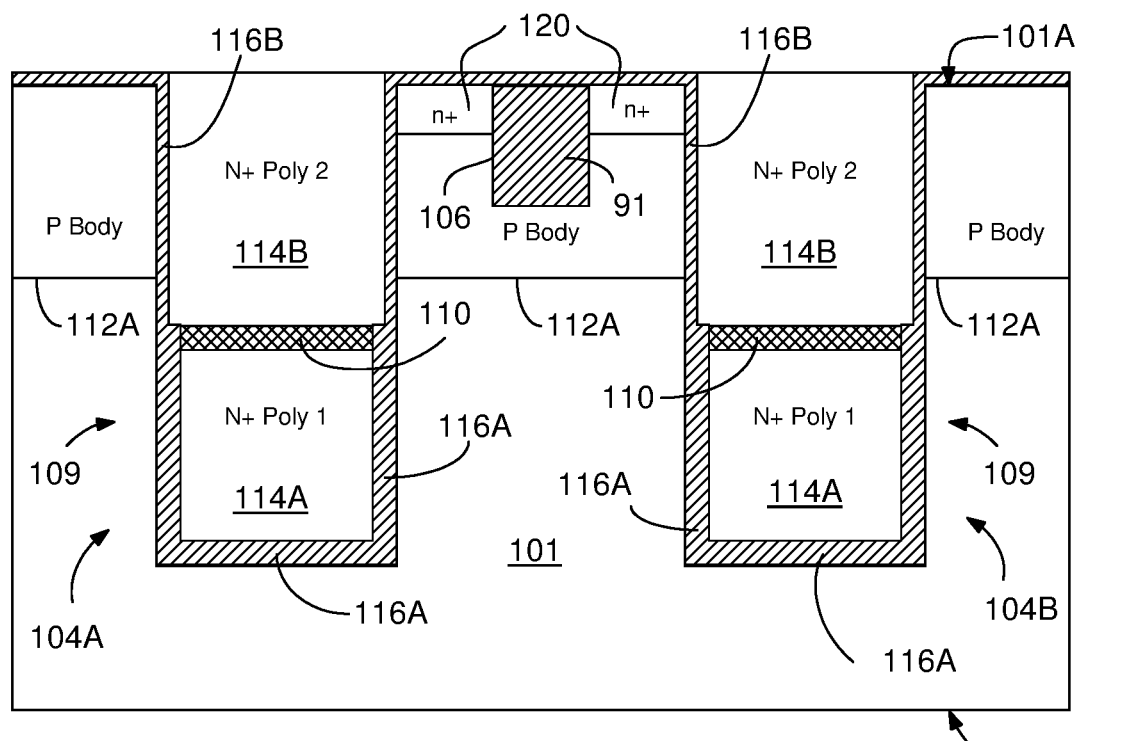

FIG. 2L shows forming of the first contact region 112A and the source regions 120. After forming the gate trench stacks 109 in the gate trenches 104, the remainder of the gate oxide on the front surface 101A is removed by CMP, a screen oxide ($SiO_2$), with about 20-30 nm thickness, may be formed on the front surface 101A. Next, using a fourth mask (mask 4) or the p body mask, the first contact region 112A or, a first p body region (p body), having p type of conductivity, may be formed by implanting p type dopants, such as boron, to the semiconductor layer 101 through the front surface 101A. A dose for this B ion implantation may be in the range of 1E14-2E12 $cm^{-2}$ to form the first contact region 112A. The first contact region 112A has a rectangular cross section and formed in a portion of the semiconductor layer 101 between the gate trenches 104. As explained above with respect to FIG. 1, an exemplary depth for the first contact region 112A may be in the range of about 0.3-1.0 micron.

In the next process step, a fifth mask (mask 5) may be used implant high doses of an n type source implant, such as P ions or As ions, to form the source regions 120 extending between the contact trenches 106 and the gate trenches 104. Source mask may be a photomask allowing source implant to be implanted to form the source regions 120 while blocking any implantation to other locations on the front surface 101A. A dose for the source implant may be in the range of 3E15-6E15 $cm^{-2}$ to form the n+ source regions 120. Because of the high n type dopant dose used to form them, n+ may be used to denote the source regions 120.

Figure 2M:
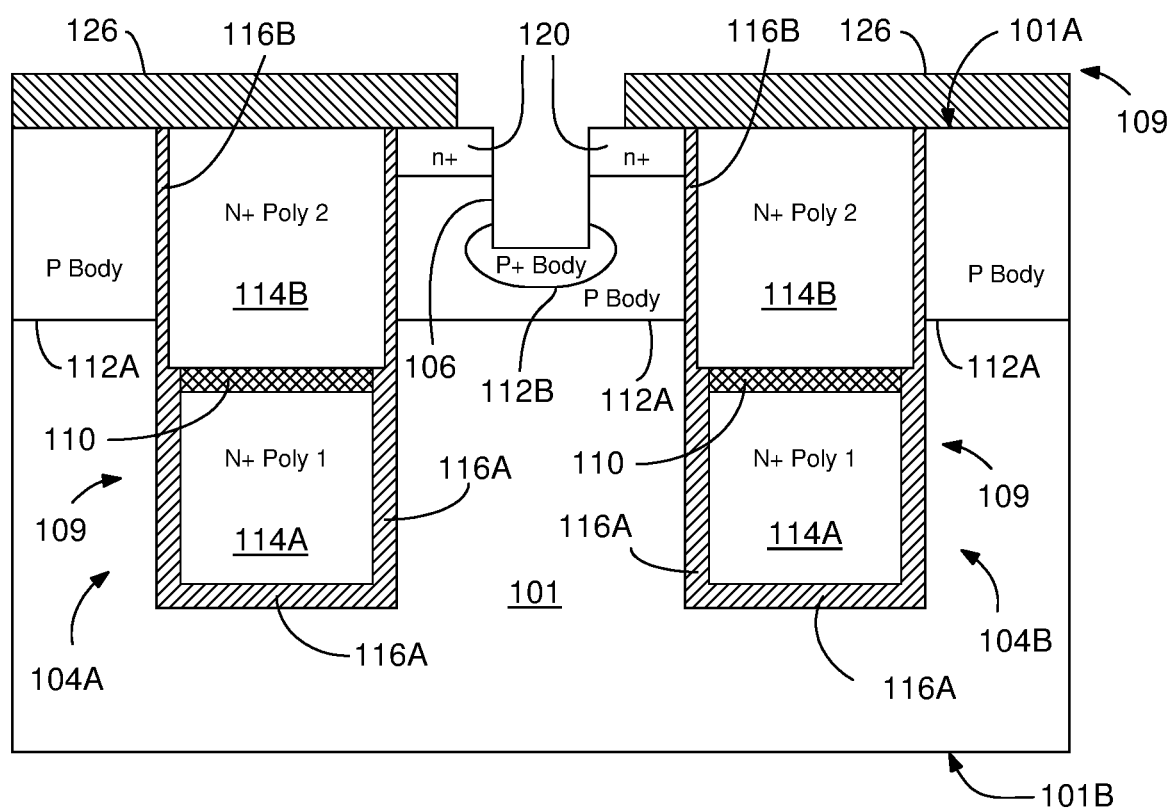

FIG. 2M shows process step using a sixth mask (mask 6), or contact mask, for forming the contacts in the contact trenches 106 in the active cell region and for forming the second contact regions 112B under the contact trench 106. Before forming the contacts, the oxide layer 91 may be removed from the contact trenches 106 and the BPSG layer 126 may be deposited on the front surface 101A. The BPSG layer 126 may have a thickness range in the range of 0.2-1 μm. The contact mask may be applied to etch the BPSG layer 126 and the oxide layer 91 filling the contact trenches 106. In the following process step, the second contact region 112B may be formed by implanting high doses of B or $BF_2$ ions to form the second contact region 112B under the contact trench 106. Because of the high p type dopant dose used to form the second contact regions 112B, p+ may be used to denote the second contact regions. The p type dopant ions may be implanted through the bottom wall 107B of the contact trench 106 to form the second contact region 112B.

In the following process steps, using the seventh mask (mask 7) or the metal mask, the buffer metal layer 124 including Ti/TiN/W having a thickness range of about 0.1-0.2 µm may be deposited on top of BPSG layer and contact trenches 106 and other contact windows. Next, a source metal layer 122 including Al:Cu:Si having thickness range of 2-8 µm about a may be deposited on top of the buffer metal layer 124 and etched to form source and the gate electrodes. In the following step, the passivation layer 128 may be formed on the source and gate metal 122 and etched using an eighth mask (mask 8) or passivation mask. The passivation layer 128 may include a layer of $SiO_2/Si_3N_4$ having a thickness of about 0.8-1 µm or a layer of $SiO_2/Si_3N_4$/polyimide having a thickness of about 3-10 µm. The buffer metal layer 124, the source metal 122 and the passivation layer 128 may be seen in FIG. 1.

Figure 3:
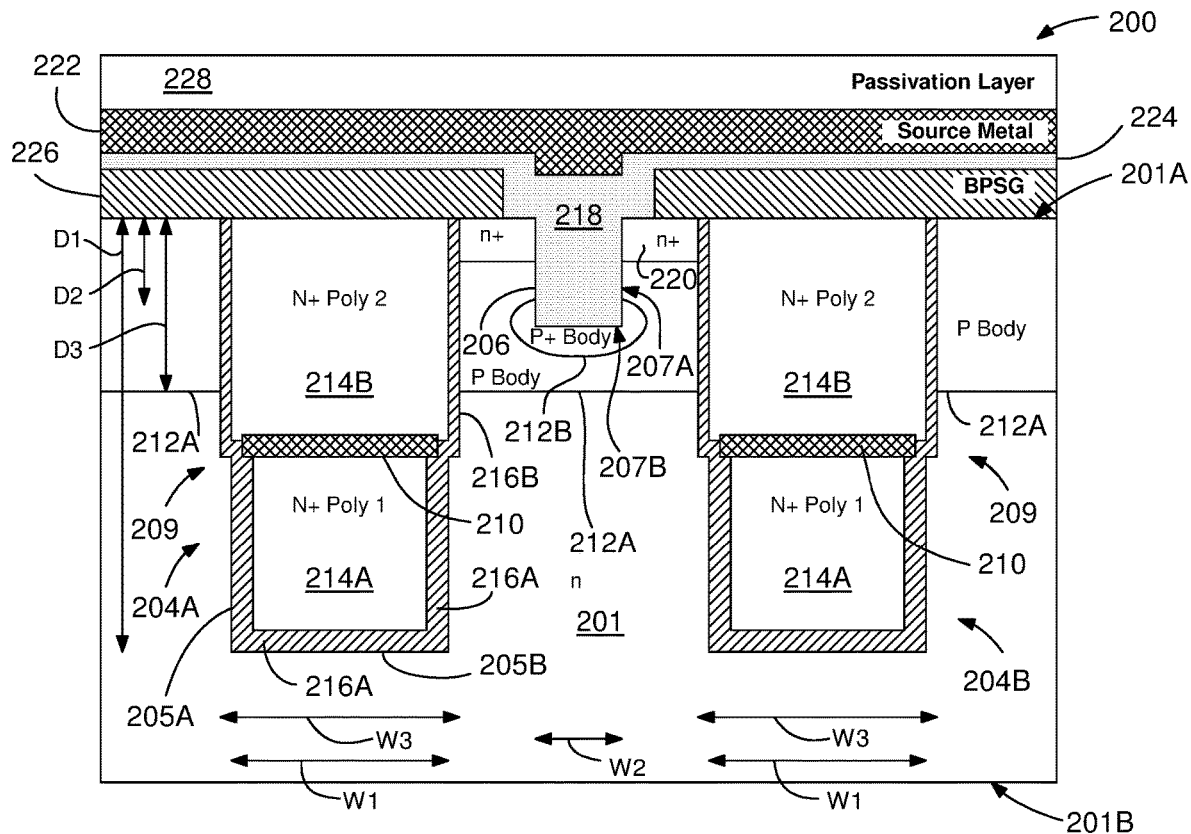
FIG. 3 is a schematic illustration of an embodiment of the present invention including a shielded gate trench MOSFET device structure for large cell pitch applications.

FIG. 3 illustrates, in schematic cross-sectional view, another embodiment of an active cell structure of a shielded gate trench MOSFET device structure 200. The device structure 200 may be an optional larger cell pitch version of the shielded gate trench MOSFET device structure 100 of the previous embodiment. In this embodiment the device structure 200 may differ from the previous embodiment 200 with the gate trench structure which is formed using an alternative process of the present invention. In order to accommodate this new gate trench stack, the upper portion of the gate trenches may be enlarged during the gate trench stack formation step. Majority of the materials, features, components and structures in this embodiment may be the same as the ones used in the previous embodiment; therefore, they will not be described in detail below and they will be given different numeral for clarity purposes.

In this embodiment, the shielded gate trench MOSFET device structure 200 may include a semiconductor layer 201 including a front surface 201A or a top surface 201A and a back surface 201B which may overlie a semiconductor substrate (not shown). The semiconductor layer 201 may be an n type epitaxial (epi) single crystal silicon layer grown over an n+ semiconductor substrate.

The semiconductor layer 201 may include an array of a plurality of gate trenches 204 and contact trenches 206 formed in an alternating fashion in an active area 208 of the MOSFET device 200, and extending orthogonally toward the back surface 201B from the front surface 201A. During the process of forming them, the gate trenches 204 and the contact trenches 206 may or may not be self-aligned in the semiconductor layer 201, i.e., the measured distance separating each gate and contact trench in the array may be the same or different.

The gate trenches 204 may be defined by side walls 205A and a bottom wall 205B, and the contact trenches 206 are defined by side walls 207A and a bottom wall 207B. The contact trenches 206 may be symmetrically positioned between the gate trenches 204, i.e., self aligned. A first contact region 212A or, a first p body contact region (p body), having a second type conductivity, may be formed by implanting p type dopants to the semiconductor layer 201 through the front surface 201A. The first contact region 212A has a rectangular cross section and formed in a portion of the semiconductor layer 201 between the gate trenches 204.

In this embodiment the gate trenches 204 may include a gate trench stack 209 including a first poly silicon layer 214A, or shield poly silicon, separated from a second poly silicon layer 214B, or gate poly silicon, by an inter poly silicon dielectric layer 210, or an IPO layer 210. The first poly silicon layer 214A may fill a bottom half of the gate trench 204 and the second poly silicon layer 214B may fill the upper half of the gate trench 204. A shield oxide layer 216A, formed by the oxidation of the side walls 205A and the bottom wall 205B of the gate trench 204. The shield oxide layer 216A together with the IPO layer 210 may electrically insulate the first poly silicon layer 214A. The gate oxide layer 216B and the IPO layer 210 may electrically insulate the second poly silicon layer 214B. As will be described more fully below, in this embodiment, the gate trench stack 209 includes a larger second poly silicon layer because of the enlargement the upper portion of the trench cavity during the process, and hence increasing the cell pitch size.

Both the first poly silicon layer 214A and the second poly silicon layer 214B may be n+ poly silicon material (n+ poly) as in the previous embodiment. A second contact region 212B, or the second p body contact region (p+ body), may be formed under the contact trench 206 by implanting p+ type dopants of the second type of conductivity through the bottom wall 207B of the contact trench 206 as in the previous embodiment. N+ source contact regions 220, or source regions 220, adjacent the front surface 201A may extend between the contact trenches 206 and the gate trenches 204 at both sides of the contact trench 206. The contact conductors 218 filling the contact trenches 206 are part of a buffer metal layer 224. A source electrode 222 may be in contact with the source regions 220, the first contact region 212A and the second contact region 212B by the buffer layer 224 extending through a dielectric layer 226 and into the contact trenches 206. The dielectric layer 226 may be a borophosphosilicate glass (BPSG) layer. A passivation layer 228 may coat the source electrode 222. The buffer layer 224 may be a layer of Ti/TiN/W and the source electrode 222 may be one of a layer of Al:Cu:Si, a layer of Al:Si or a layer of Al:Cu.

Figure 4A:
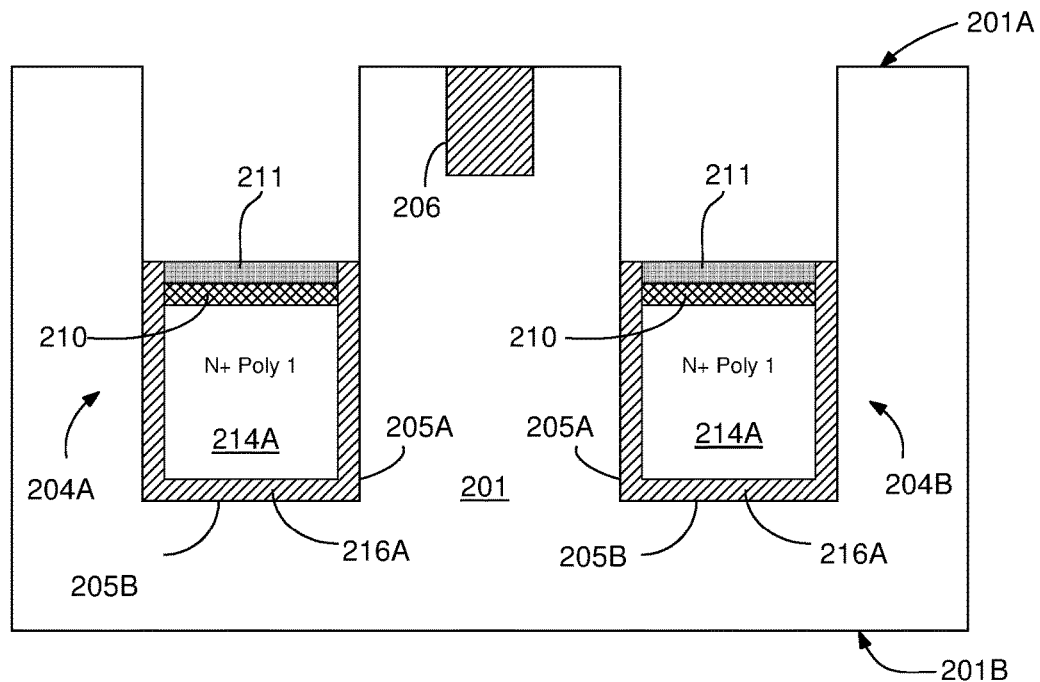
FIGS. 4A-4D are schematic illustrations of exemplary steps of another method embodiment for forming a shielded gate trench MOSFET device structure for large cell pitch applications.

Initial process steps for forming the SGT MOSFET device structure 200 shown in FIG. 3 may also follow the process steps shown in FIGS. 2A-2G. However, as shown in FIG. 4A, using the second mask (mask 2), in this embodiment, after the thickness of the deposited undoped poly silicon material over the IPO layer 210 may be reduced to a thickness range of about 0.1 µm to form the UPS layer 211, an oxide etching process may be conducted to completely remove the portions of the trench oxide layer 216A exposed on the trench side walls 205A.

Figure 4B:
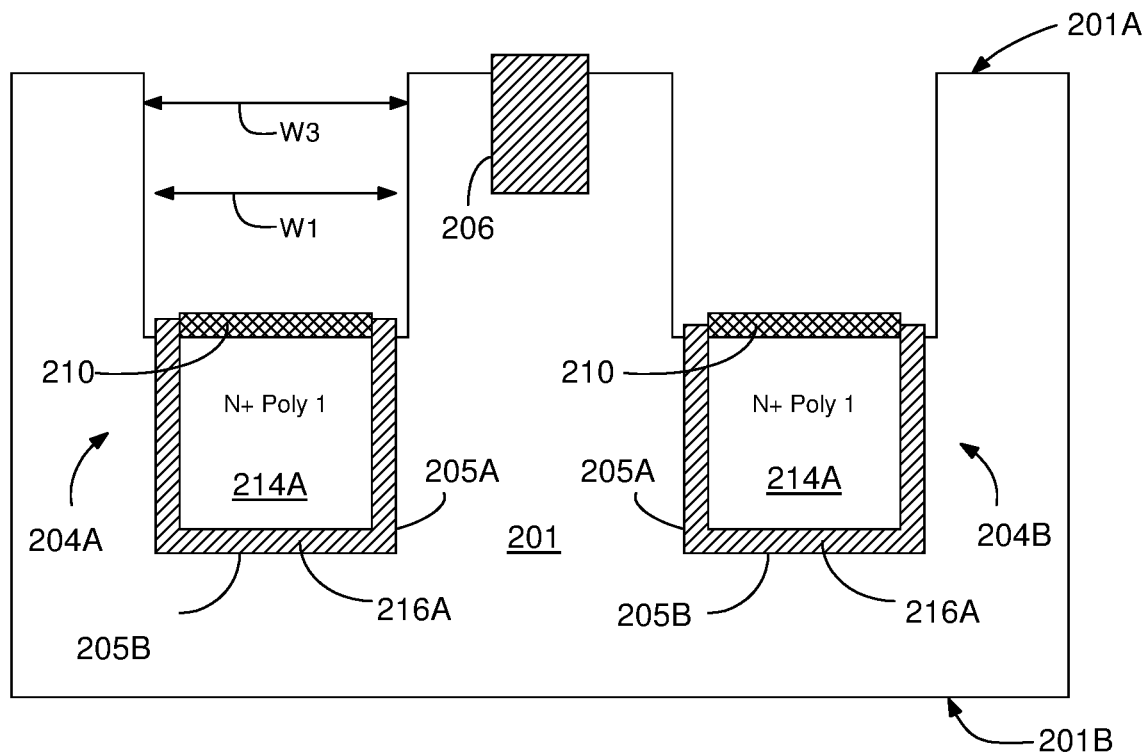

As shown in FIG. 4B, after removing the trench oxide layer 216A on the side walls, the UPS layer 211 may be removed using a poly silicon etching step to expose the top surface of the IPO layer 210. However, the same etching process may also etch the oxide free portions of the silicon side walls resulting in widening of the upper side of the gate trench cavity, in the range of about 0.05 µm to 0.3 µm, for the large cell pitch devices. In this configuration, while the bottom portion of the gate trench may have the first width W1, the widened upper portion of the gate trench may have a third width. An exemplary third width may be in range of 0.35 µm to 1.5 µm. Furthermore, an exemplary ratio of W3 to W1 may be in the range of about 1.10-1.3 µm.

Figure 4C:
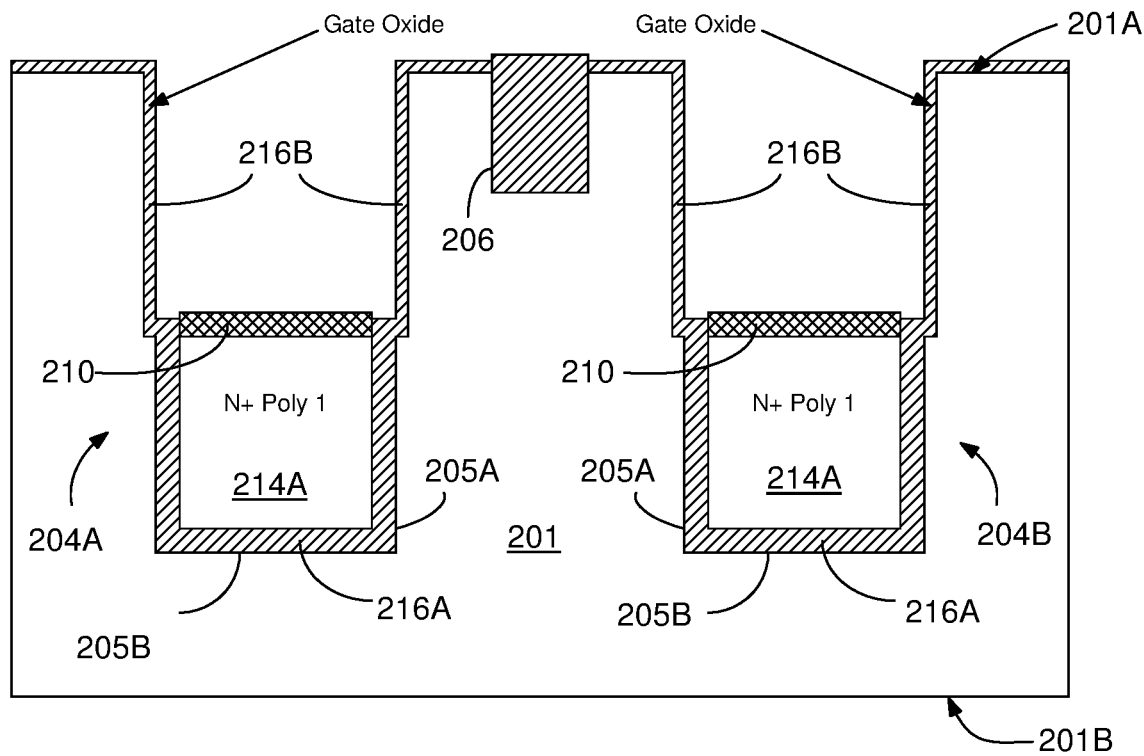

As shown in FIG. 4C, once the top surface of the IPO layer 210 is exposed, a gate oxide layer 216B may be formed on the side walls 205A of the gate trenches 204 by oxidizing the exposed silicon surfaces of the side walls in the upper wider cavity portion of the gate trenches 104. The gate oxide layer 216B may have a thickness in the range of 10-150 nm and smoothly continues, without any gaps, from the trench oxide layer 216A surrounding the first poly silicon layer 214A with the IPO layer 210. This trench oxide layer 216A will be referred to as the shield oxide layer 216A hereinafter. The gate oxide layer 216B may be grown thermally, and it may include a few percent chlorine to prevent drifting of the threshold voltage of the MOSFET device.

Figure 4D:
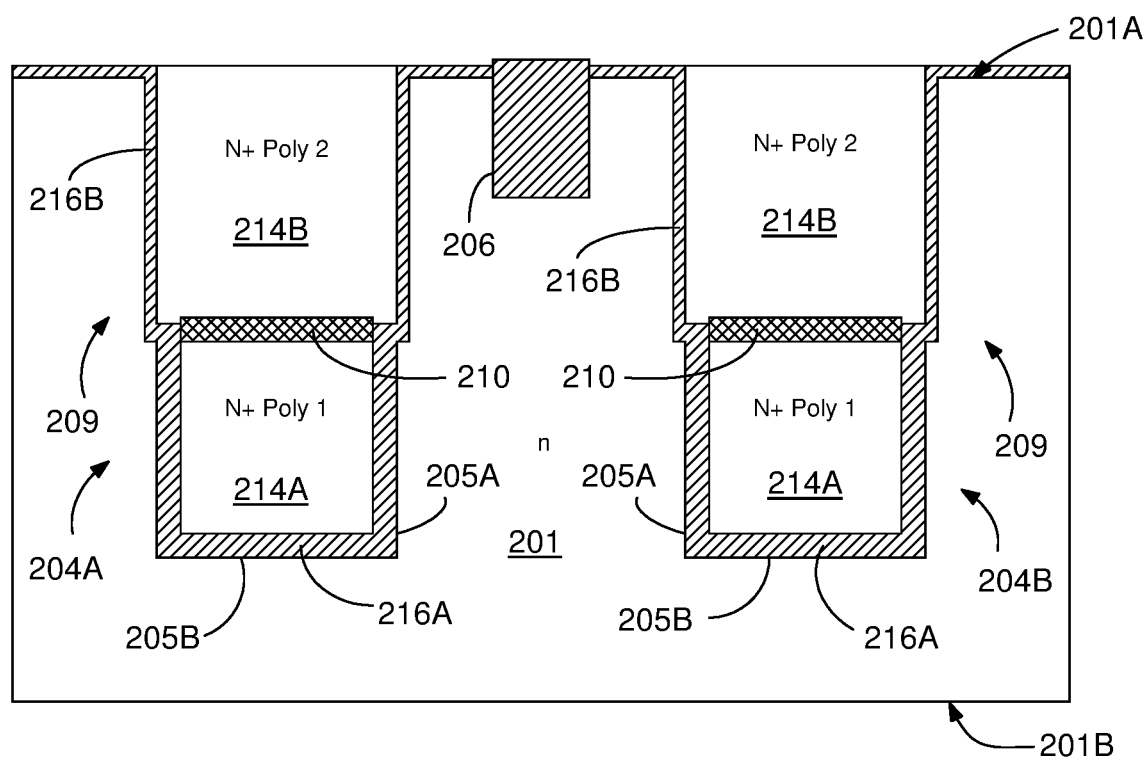

As shown in FIG. 4D, once the gate oxide layer is grown 216B on the side walls 205A, the second poly silicon layer 214B may be deposited into the cavity of the gate trench 204 defined by the IPO layer 210 on the first poly silicon layer 214A and the gate oxide layer 216B on the side walls 205A. The second poly silicon layer 214B may fill the gate trenches 104 and cover the front surface 201A of the semiconductor layer 201. In the next step, the second poly silicon layer 214B may be either planarized using a CMP process or etched down to form the second poly silicon layer 214B in the gate trenches 204. The second poly silicon layer 214A is etched back, this process may be performed using a third mask (mask 3). Formation of the second poly silicon layer 214B in the enlarged cavity portion of the gate trenches 104 also completes the structure of the gate trench stack 209 for this embodiment.

In the following process steps, similar to the steps shown in FIGS. 2L-2M, using appropriate process masks the first contact region 212A (p body contact region), the source regions 220 (n+ source contact regions), BPSG layer 226 formation, the second contact region 212B (p+ body contact region), the buffer layer 224, the source metal 222 (source electrode) and the passivation layer 228 may be formed, all of which are shown in FIG. 3.

Figure 5A:
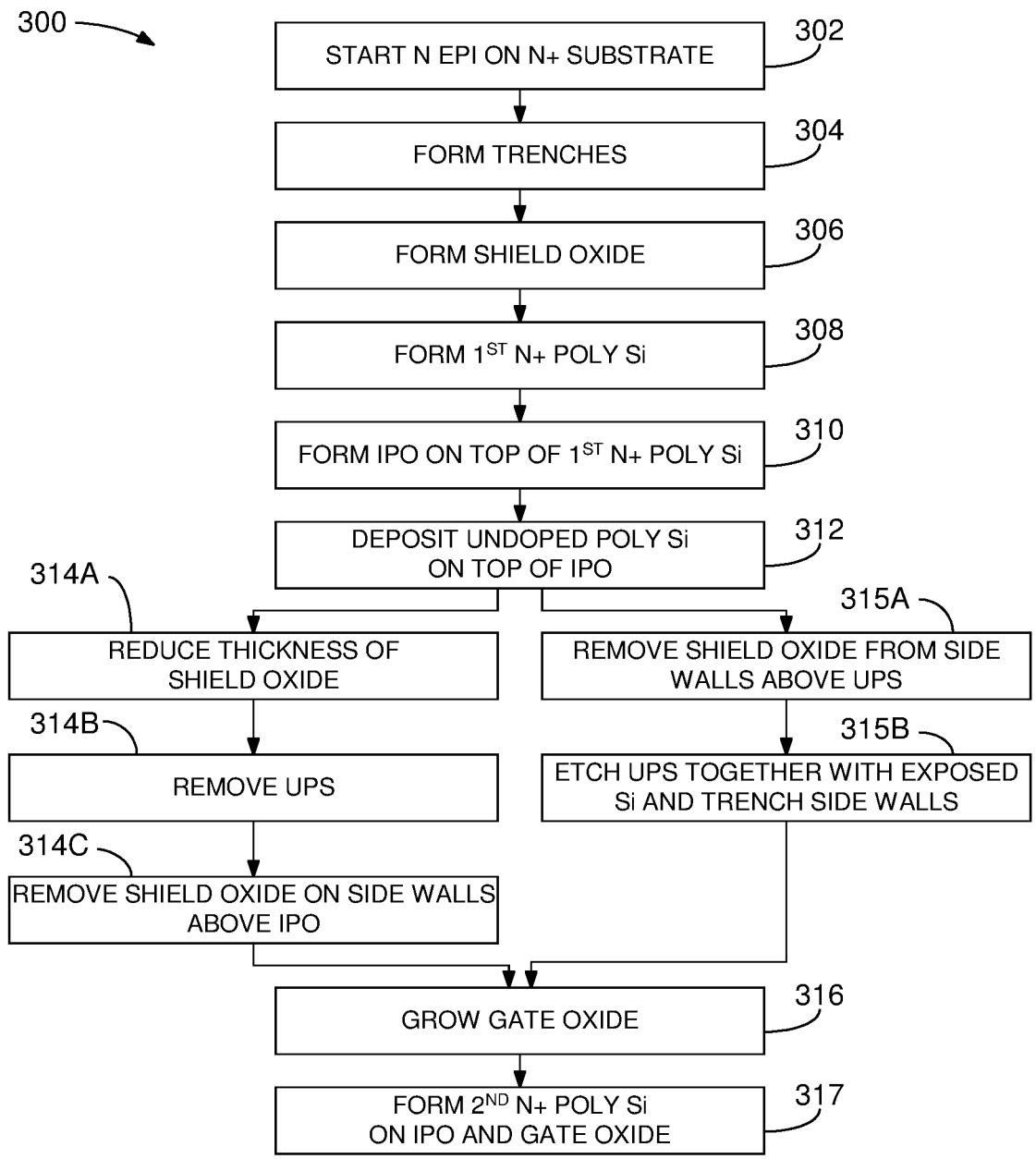
FIGS. 5A-5B show a flow chart including process embodiments of the present invention.
Figure 5B:
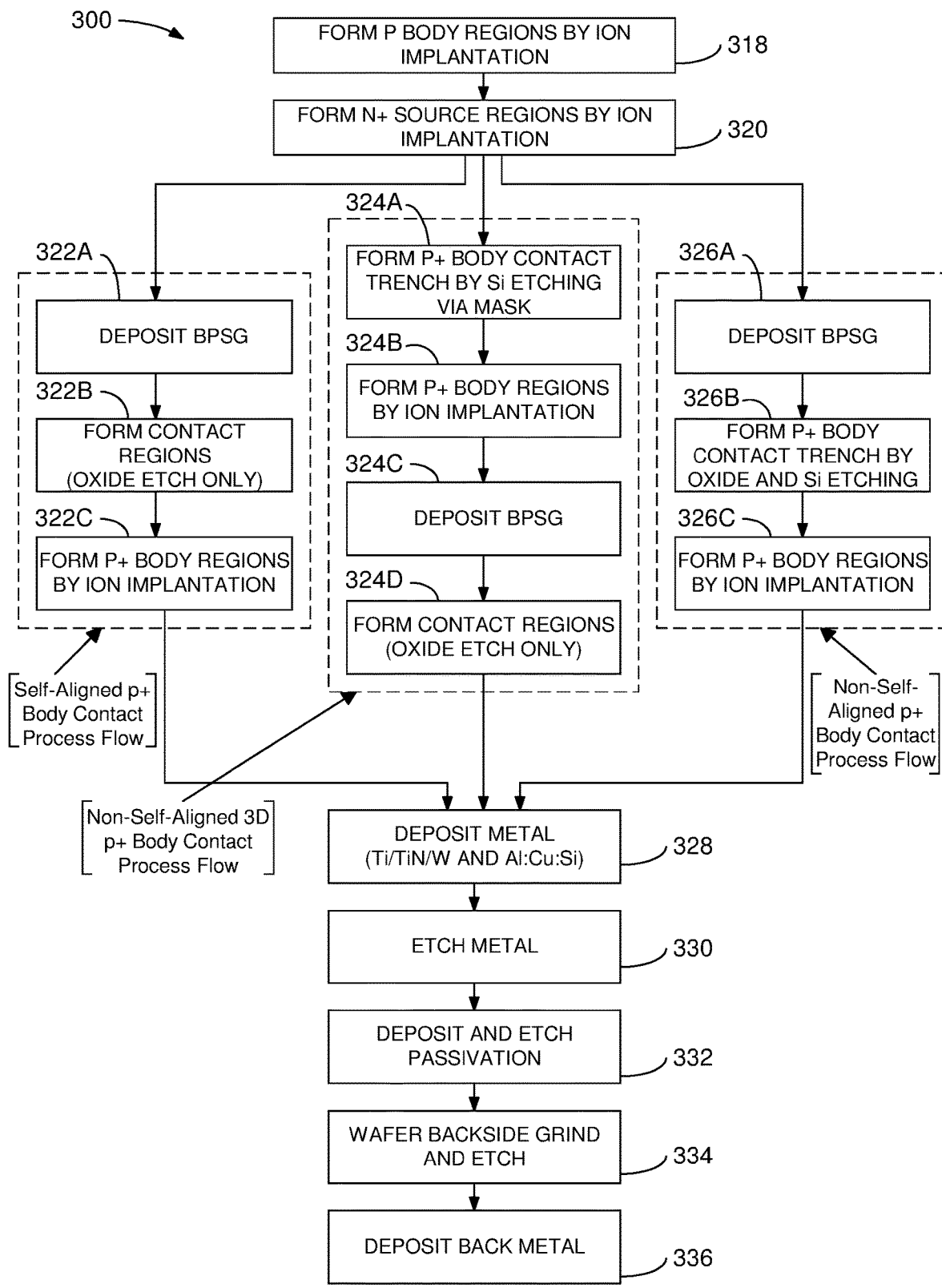

Flow charts in FIGS. 5A-5B show an exemplary process flow embodiment 300 of the present invention. FIG. 5B is continuation of FIG. 5A. Referring to FIG. 5A, and collectively to the figures, in one embodiment, in step 302, starting wafer may include an n silicon epitaxial layer (n epi layer) grown on an n+ silicon substrate. In step 304, gate trenches and contact trenches may be formed in the n epi layer. In step 306, a shield oxide layer (SiO$_2$) may be formed on trench side walls and bottom walls of the gate trenches. The shield oxide layer may preferably be grown on the silicon side walls and bottom walls. In step 308, a first n+ poly Si layer formed within a lower half of the trench cavity which is entirely coated with the shield oxide layer formed in step 306. In step 310, an inter poly silicon dielectric layer (IPO layer) may be formed on top of the first n+ poly Si layer. IPO layer is a poly Si oxide (SiO$_2$) layer and may be formed by either thermally growing the poly silicon oxide on the first doped poly silicon layer or depositing the poly silicon oxide on the first doped poly silicon layer. In one embodiment, IPO layer may have a thickness of about 1.5 the thickness of the gate oxide layer formed in step 316. In step 312, a layer of undoped poly Si (UPS) may be formed on the IPO layer.

Following step 312, in one embodiment, in step 314A, the thickness of the portion of the shield oxide layer exposed in the upper half of the trench cavity, may be etched down to a predetermined thickness of about 20-30 nm. In step 314B, the undoped poly Si layer on top of the IPO layer may be etched completely to expose the IPO layer underneath. In step 314C, the shield oxide layer portion having reduced thickness may be removed from the trench side walls, which process exposes silicon side walls of the upper half of the trench.

In an alternative process embodiment sequence, after step 312, in step 315A, the portion of the shield oxide layer exposed in the upper half of the trench cavity, may be completely etched and removed from the trench side walls, which process exposes silicon side walls of the upper half of the trench. In step 315B, both undoped poly Si layer and the exposed portions of the silicon side walls may be etched together to completely remove the UPS layer while enlarging the upper half of the trench cavity. After either following the process sequence through steps 314A-314C or steps 315A-315B, in step 316, the gate oxide layer of about 10-150 nm may be grown on the on the exposed silicon side walls of the upper portion of the trench cavity. Next, in step 317, a second n+ poly Si layer formed within the upper half of the trench cavity and on the IPO layer. This step completes the structure of gate trench stack.

Referring to FIG. 5B, and collectively to the figures, in one embodiment, after completion of the gate trench stacks, in steps 318 and 320, p body regions and n+ source regions may be formed by implanting p type dopants and n type dopants, respectively, adjacent the front surface of the n epi layer and between the gate trenches.

After step 320, in one embodiment, self-aligned p+ body regions may formed by conducting the following process steps. In step 322A, a BPSG layer may be formed on the front surface of the n epi layer. Next, in step 322B, a silicon oxide etching is applied to remove silicon oxide in the contact trenches, and in following step 322C, p+ body regions may be formed by implanting p type dopants through the contact trench.

In another embodiment, after step 320, non-self-aligned stripe or rectangular p+ body contact regions may be formed by conducting the following process steps. For this particular process flow is possible when only gate trenches are formed in step 304 but not the contact trenches. Accordingly, in step 324A, contact trenches may be formed between the gate trenches via a mask. In step 324B, p+ body regions may be formed by implanting p type dopants through the contact trenches. In step 324C, a BPSG layer may be formed on the front surface of the n epi layer. Next, in step 324D, a silicon oxide etching is applied to remove BPSG in the contact trenches.

In another embodiment, after step 320, non-self-aligned p+ body contact regions may be formed by conducting the following process steps. This particular process flow is only possible when only the gate trenches are formed in step 304 but not the contact trenches. Accordingly, in step 326A, the BPSG layer may be formed on the front surface of the n epi layer. In step 326B, contact trenches may be formed between the gate trenches by utilizing a silicon oxide etching to etch BPSG layer and then silicon etching. In step 326C, p+ body regions may be formed by implanting p type dopants through the contact trenches.

After selecting one of the process sequences shown through steps 322A-322C, steps 324A-324D, and steps 326A-326C, in step 328, the metal layer including Ti/TiN/W and Al:Si:Cu, or AlCu or Al:Si may be deposited on the PBSG layer. In step 330, the metal layer may be etched. In step 332, a passivation layer may be deposited and etched. In step 334, wafer backside may be ground and etched. Next, in step 336, back metal layer may be deposited on the backside.

Although aspects and advantages of the present invention are described herein with respect to certain embodiments, modifications of the embodiments will be apparent to those skilled in the art. Thus, the scope of the present invention should not be limited to the foregoing discussion, but should be defined by the appended claims.

I claim:

1. A method for forming shielded gate trench MOSFET devices, including:
   providing a silicon layer having a first type conductivity overlying a semiconductor substrate;
   forming, on a front surface of the silicon layer, an array of a plurality of gate trenches and contact trenches disposed in an alternating fashion in an active region of the front surface, the array of the gate trenches and the contact trenches extending orthogonally from the front surface toward the semiconductor substrate,
wherein each gate trench defining a first depth and a first width and each contact trench defining a second depth and a second width, and wherein the first depth and the first width are greater than the second depth and the second width, respectively;
forming in each gate trench a gate trench stack including:
growing a shield oxide layer including silicon oxide on side walls and a bottom wall of each gate trench;
forming a first doped poly silicon layer on the shield oxide layer within the gate trench;
forming a silicon oxide layer on the first doped poly silicon layer;
forming an undoped poly silicon layer on the silicon oxide layer;
reducing the thickness of exposed portions of the shield oxide layer on the side walls to a predetermined thickness;
removing the undoped poly silicon layer to expose the silicon oxide layer underneath;
etching the shield oxide layer having the predetermined thickness from the side walls of the gate trench, which results in exposing surface of the trench side walls above the silicon oxide layer, wherein etching the shield oxide layer having the predetermined thickness also reduces the thickness of the silicon oxide layer by the same predetermined thickness;
growing a gate oxide layer on the trench side walls and exposed silicon surfaces; and
forming a second doped poly silicon layer on the gate oxide layer and the silicon oxide layer and planarizing it.

2. The method of claim 1, wherein forming the silicon oxide layer includes forming a poly silicon oxide layer having a thickness equal or greater than 1.5 times the thickness of the gate oxide layer.

3. The method of claim 1, wherein forming the silicon oxide layer includes one of:
thermally growing the poly silicon oxide on the first doped poly silicon layer, and
depositing silicon dioxide on the first doped poly silicon layer.

4. The method of claim 1, wherein forming the undoped poly silicon layer includes depositing undoped poly silicon onto the silicon oxide layer and etching it back to a thickness ranging from 100 nm to 150 nm.

5. The method of claim 1, wherein the predetermined thickness after reducing the thickness of the exposed portions of the shield oxide layer is about 20-30 nm.

6. The method of claim 5, wherein reducing the thickness of the exposed portions of the shield oxide layer is performed using an isotopic etching process.

7. The method of claim 1, wherein growing the shield oxide layer includes growing a shield oxide layer having a thickness in the range of about 50-500 nm.

8. The method of claim 1, wherein growing the gate oxide layer includes growing a gate oxide layer having a thickness in the range of about 10-150 nm.

9. The method of claim 1, wherein the first doped poly silicon layer and the second doped poly silicon layer are implanted with n+ ions.

10. The method of claim 1, wherein each contact trench is self aligned with respect to the gate trenches at both sides of the contact trench, thereby each contact trench is symmetrically positioned between the gate trenches.

11. The method of claim 1, wherein each contact trench is non self-aligned with respect to the gate trenches at both sides of the contact trench, thereby each contact trench is not symmetrically positioned between the gate trenches.

12. The method of claim 1 further comprising forming a first contact region by implanting dopants with a second type conductivity to the semiconductor layer, wherein the first contact region extends between the adjacent gate trenches in the array, wherein the depth of the first contact region is less than the first depth and greater than the second depth.

13. The method of claim 12 further comprising forming a second contact region of the second type conductivity located at least partially within the first contact region and under the contact trench by implanting dopants with the second type conductivity through a bottom wall of each gate trench, wherein the second contact region has a higher second type conductivity dopant concentration than the first contact region.

14. The method of claim 13 further comprising coating the front surface with a dielectric layer.

15. The method of claim 14 further comprising forming a contact structure within each contact trench, each contact structure is in electrical connection with a source electrode, wherein the second doped contact region is in electrical contact with the source electrode via the contact structures.

16. The method of claim 15, wherein the contact structures in the contact trenches are an integral part of a conductive buffer layer on the dielectric layer.

17. The method of claim 16, wherein the conductive buffer layer on the dielectric layer includes a layer of Ti/TiN/W.

18. The method of claim 17, wherein the source electrode is located on the conductive buffer layer.

19. The method of claim 18, wherein the source electrode includes one of a layer of Al:Cu:Si, a layer of Al:Si, and a layer of Al:Cu.

20. A method for forming shielded gate trench MOSFET devices, including:
providing a silicon layer having a first type conductivity overlying a semiconductor substrate;
forming, on a front surface of the silicon layer, an array of a plurality of gate trenches and contact trenches disposed in an alternating fashion in an active region of the front surface, the array of the gate trenches and the contact trenches extending orthogonally from the front surface toward the semiconductor substrate,
wherein each gate trench defining a first depth and a first width and each contact trench defining a second depth and a second width, and wherein the first depth and the first width are greater than the second depth and the second width, respectively;
forming in each gate trench a gate trench stack including:
growing a shield oxide layer including silicon oxide on side walls and a bottom wall of each gate trench;
forming a first doped poly silicon layer on the shield oxide layer within the gate trench;
forming a silicon oxide layer on the first doped poly silicon layer;
forming an undoped poly silicon layer on the silicon oxide layer;
removing exposed portions of the shield oxide layer from the side walls of the gate trench, which results in exposing surface of the trench side walls above the silicon oxide layer;
etching the undoped poly silicon layer to expose the silicon oxide layer underneath, wherein etching the undoped poly silicon layer also etches the surface of the side walls, which are exposed, resulting in increasing the width of the gate trench to a third width above the silicon oxide layer with respect to the first width of the gate trench below the silicon oxide layer;

growing a gate oxide layer on the surface of the trench side walls and all the exposed silicon surfaces; and forming a second doped poly silicon layer on gate oxide layer and the silicon oxide layer and planarizing it.

21. The method of claim 20, wherein forming the silicon oxide layer includes forming a poly silicon oxide layer having a thickness equal to at least 1.5 times the thickness of the gate oxide layer.

22. The method of claim 20, wherein forming the silicon oxide layer includes one of:

thermally growing the poly silicon oxide on the first doped poly silicon layer, and depositing silicon dioxide on the first doped poly silicon layer.

23. The method of claim 20, wherein forming the undoped poly silicon layer includes depositing undoped poly silicon onto the silicon oxide layer and etching it back to a thickness ranging from 100 nm to 150 nm.

24. The method of claim 20, wherein growing the shield oxide layer includes growing a shield oxide layer having a thickness in the range of about 50-500 nm.

25. The method of claim 20, wherein growing the gate oxide layer includes growing a gate oxide layer having a thickness in the range of about 10-150 nm.

26. The method of claim 20, wherein the first doped poly silicon layer and the second doped poly silicon layer are n+ poly silicon.

27. The method of claim 20, wherein each contact trench is self-aligned with respect to the gate trenches at both sides of the contact trench, thereby each contact trench is symmetrically positioned between the gate trenches.

* * * * *